United States Patent
Santangelo et al.

(10) Patent No.: US 10,297,677 B2
(45) Date of Patent: *May 21, 2019

(54) LDMOS POWER SEMICONDUCTOR DEVICE AND MANUFACTURING METHOD OF THE SAME

(71) Applicant: STMicroelectronics S.r.l., Agrate Brianza (IT)

(72) Inventors: Antonello Santangelo, Belpasso (IT); Salvatore Cascino, Gravina di Catania (IT); Leonardo Gervasi, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/927,646

(22) Filed: Mar. 21, 2018

(65) Prior Publication Data
US 2018/0212042 A1 Jul. 26, 2018

Related U.S. Application Data

(60) Continuation of application No. 14/964,130, filed on Dec. 9, 2015, now Pat. No. 9,954,079, which is a
(Continued)

(30) Foreign Application Priority Data

Jan. 11, 2013 (IT) .............................. TO2013A0021

(51) Int. Cl.
*H01L 29/66* (2006.01)
*H01L 27/088* (2006.01)
(Continued)

(52) U.S. Cl.
CPC .. *H01L 29/66681* (2013.01); *H01L 21/26586* (2013.01); *H01L 21/823418* (2013.01);
(Continued)

(58) Field of Classification Search
CPC ......... H01L 29/66681; H01L 29/66689; H01L 21/823418; H01L 29/66727; H01L 29/404;
(Continued)

(56) References Cited

U.S. PATENT DOCUMENTS 5,701,026 A * 12/1997 Fujishima ........... H01L 29/0634
257/335
7,589,378 B2 9/2009 Kocon et al.
(Continued)

FOREIGN PATENT DOCUMENTS

| EP | 2 202 794 A2 | 6/2010 |
|----|----|----|
| JP | 2009081385 A | 4/2009 |
| WO | 2011/054009 A2 | 5/2011 |

OTHER PUBLICATIONS

Shen et al., "Performance Analysis of Lateral and Trench Power MOSFETs for Multi-MHz Switching Operation," PowerSOC Workshop, Florida Power Electronics Center, School of Electrical Engineering and Computer Science, University of Central Florida, date unknown, 24 pages.

*Primary Examiner* — Su C Kim
(74) *Attorney, Agent, or Firm* — Seed IP law Group LLP

(57) ABSTRACT

Methods are directed to forming an electronic semiconductor device that includes a body having a first side and a second side opposite to one another and including a first structural region facing the second side, and a second structural region extending over the first structural region and facing the first side. A body region extends in the second structural region at the first side. A source region extends inside the body region and a lightly-doped drain region faces
(Continued)

the first side of the body. A gate electrode is formed over the body region. A trench dielectric region extends through the second structural region in a first trench conductive region immediately adjacent to the trench dielectric region. A second trench conductive region is in electrical contact with the body region and source region. An electrical contact on the body is in electrical contact with the drain region through the first structural region.

20 Claims, 21 Drawing Sheets

Related U.S. Application Data division of application No. 14/151,527, filed on Jan. 9, 2014, now Pat. No. 9,324,838.

(51) Int. Cl.

| H01L 29/417 | (2006.01) |
|---|---|
| H01L 29/08 | (2006.01) |
| H01L 21/265 | (2006.01) |
| H01L 29/40 | (2006.01) |
| H01L 29/78 | (2006.01) |
| H01L 21/8234 | (2006.01) |
| H01L 29/49 | (2006.01) |
| H01L 29/10 | (2006.01) |
| H01L 29/06 | (2006.01) |

(52) U.S. Cl.
CPC ........ *H01L 27/088* (2013.01); *H01L 29/0878* (2013.01); *H01L 29/0886* (2013.01); *H01L 29/404* (2013.01); *H01L 29/407* (2013.01); *H01L 29/41766* (2013.01); *H01L 29/66689* (2013.01); *H01L 29/66719* (2013.01); *H01L 29/66727* (2013.01); *H01L 29/7802* (2013.01); *H01L 21/823487* (2013.01); *H01L 29/063* (2013.01); *H01L 29/0634* (2013.01); *H01L 29/1095* (2013.01); *H01L 29/4175* (2013.01); *H01L 29/4933* (2013.01); *H01L 29/66613* (2013.01); *H01L 29/7835* (2013.01)

(58) Field of Classification Search
CPC ............. H01L 29/407; H01L 29/66719; H01L 21/26586; H01L 29/0886; H01L 29/7802; H01L 29/0878; H01L 29/41766; H01L 27/088; H01L 29/66613; H01L 21/823487; H01L 29/4175; H01L 29/0634; H01L 29/063; H01L 29/4933; H01L 29/1095; H01L 29/7835
See application file for complete search history.

(56) References Cited

U.S. PATENT DOCUMENTS

| 7,829,947 | B2 | 11/2010 | Hébert |
| 7,936,007 | B2 | 5/2011 | Marchant et al. |
| 8,193,559 | B2 | 6/2012 | Haeberlen et al. |
| 2002/0053699 | A1 | 5/2002 | Kim et al. |
| 2002/0175351 | A1 | 11/2002 | Baliga |
| 2004/0056284 | A1* | 3/2004 | Nagaoka ............ H01L 27/0207 257/253 |
| 2005/0205897 | A1 | 9/2005 | Depetro et al. |
| 2007/0085204 | A1 | 4/2007 | Korec et al. |
| 2009/0298248 | A1 | 12/2009 | Fung |
| 2010/0237411 | A1 | 9/2010 | Hsieh |
| 2010/0237416 | A1 | 9/2010 | Hebert |
| 2010/0327348 | A1 | 12/2010 | Hashimoto et al. |
| 2011/0127602 | A1 | 6/2011 | Mallikarjunaswamy |
| 2013/0313640 | A1 | 11/2013 | Shen et al. |
| 2014/0197487 | A1 | 7/2014 | Cascino et al. |
| 2015/0206968 | A1 | 7/2015 | Cascino et al. |

* cited by examiner

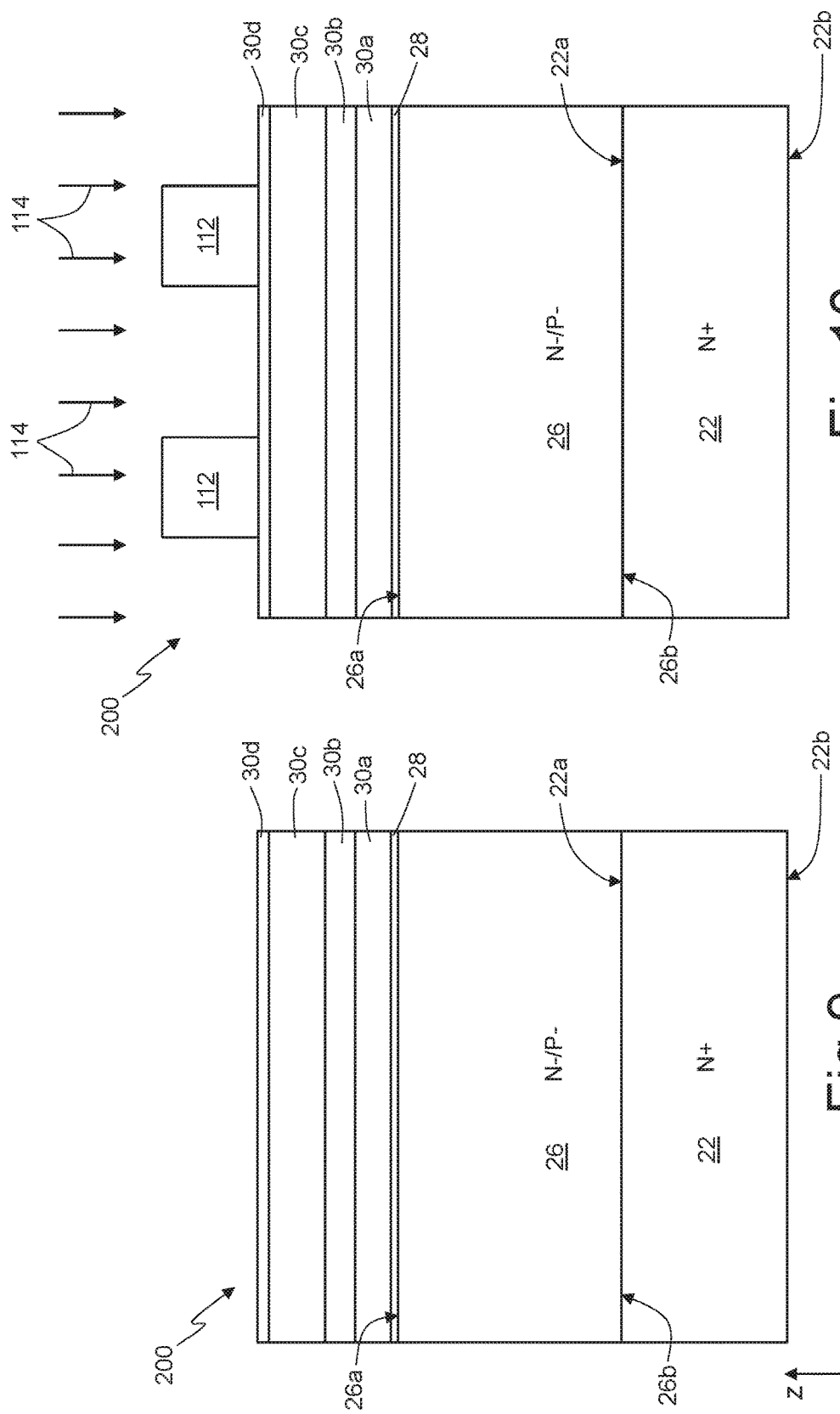

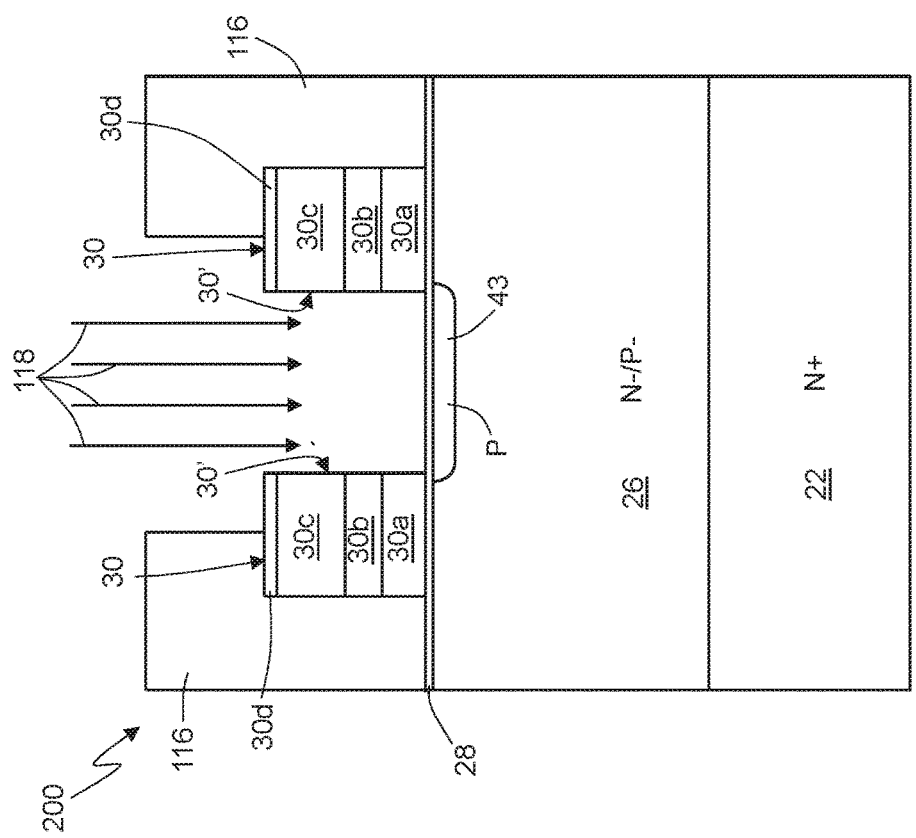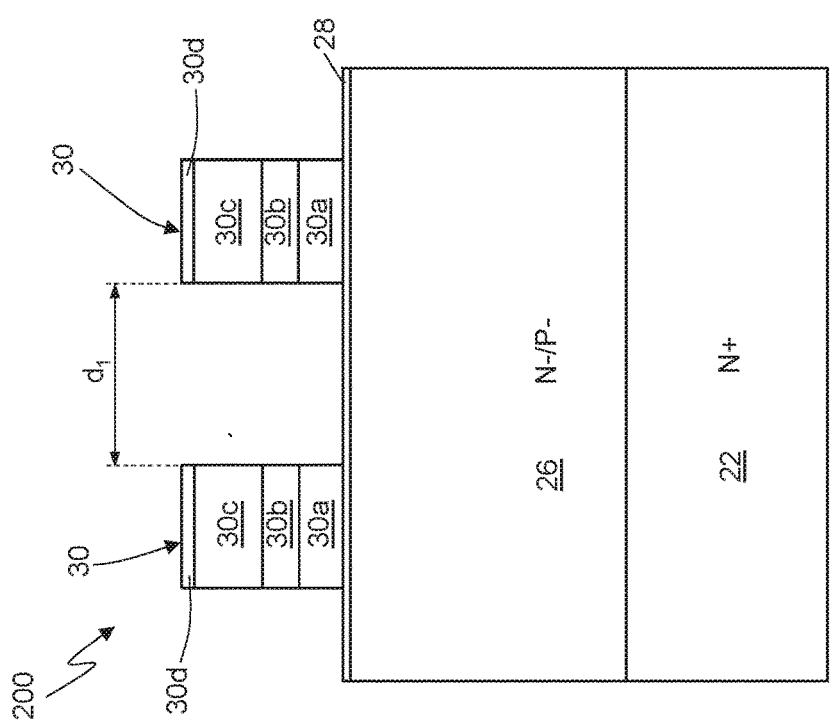
Fig. 12
Fig. 11

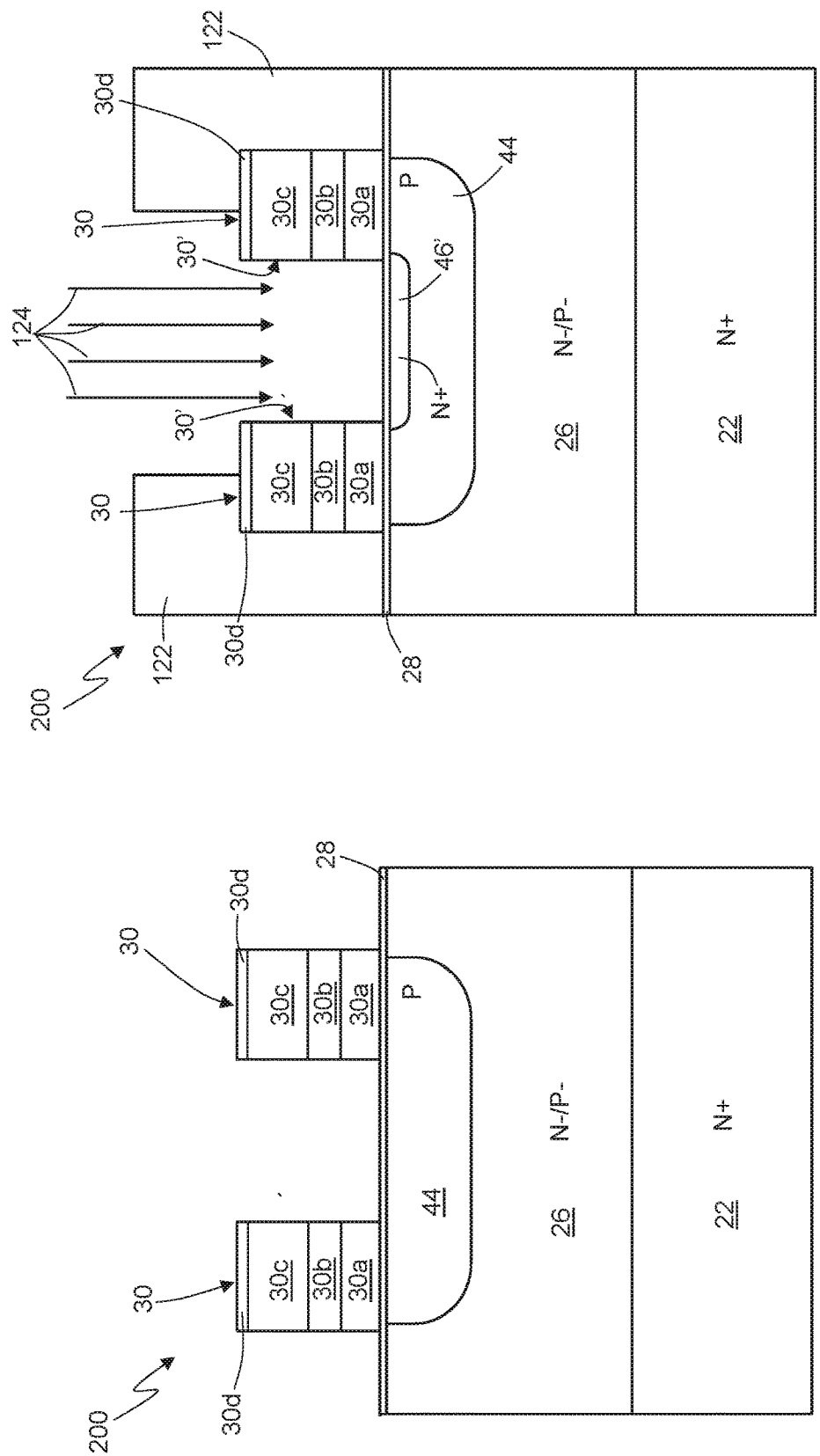

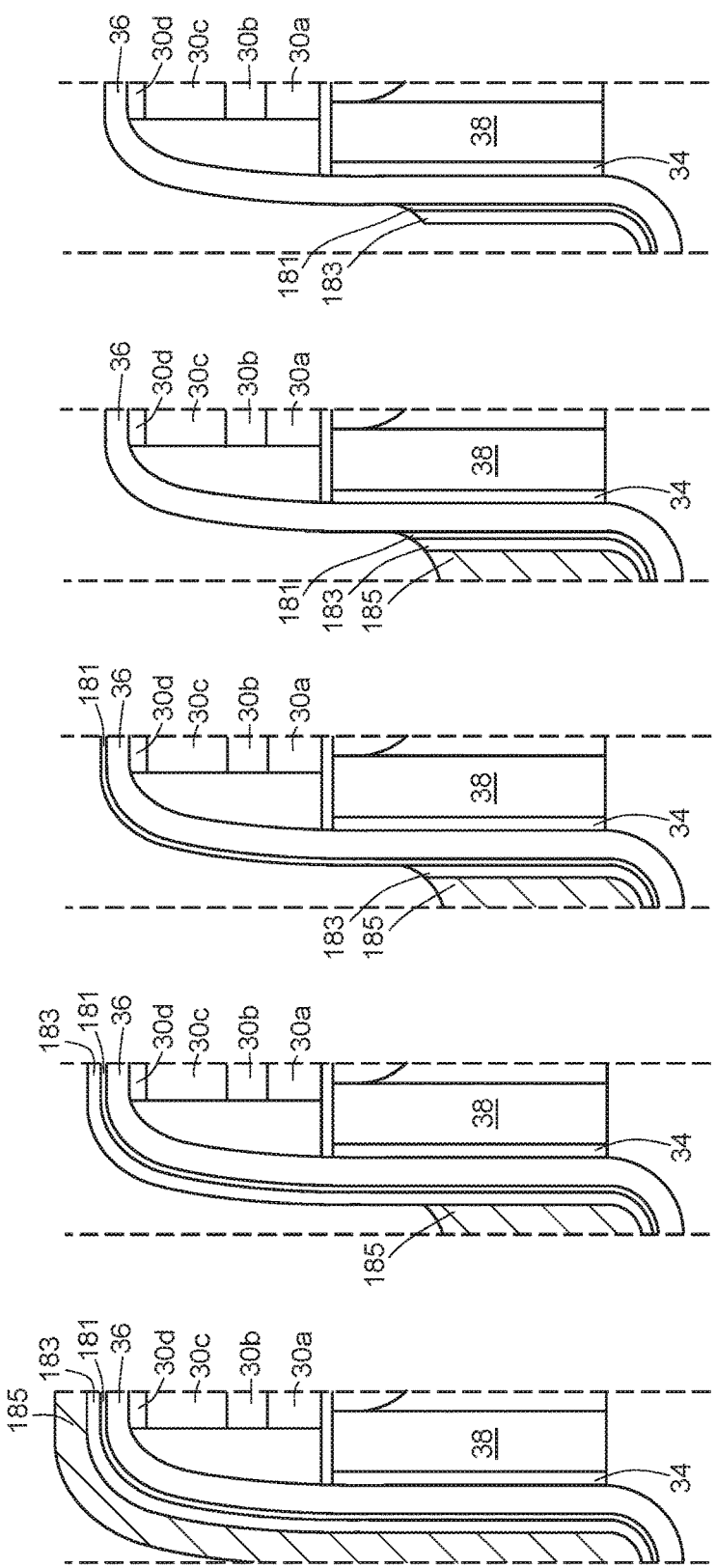

LDMOS POWER SEMICONDUCTOR DEVICE AND MANUFACTURING METHOD OF THE SAME

BACKGROUND

Technical Field

The present disclosure relates to an LDMOS semiconductor device and to a method for manufacture thereof.

Description of the Related Art

As is known, some applications of MOSFET power devices (or power MOSFETs) operate said MOSFET power devices at high switching frequencies. An example is that of electrical switches used in the field of high-frequency pulse-width modulation (PWM). In order to maximize the efficiency of the device, it is expedient for the levels of dynamic performance to exhibit a negligible loss of power during the switching operations. Said condition is obtained by minimizing the values of capacitance of the parasitic capacitors internal to said devices. Particular attention is directed at minimization of the gate-to-drain capacitance $C_{GD}$, since said capacitance $C_{GD}$ determines the duration of the period of transient of the voltage signal during switching. It is hence of importance to minimize the value of capacitance $C_{GD}$ so as to minimize the power losses of the MOSFET power device. A parameter, which is strictly linked to the parasitic capacitance and is typically used for characterizing the efficiency of a MOSFET power device during switching, is the gate charge $Q_G$. In fact, the value of gate charge $Q_G$ furnishes an estimate of the amount of current to supply to the gate terminal of the MOSFET power device to obtain switching of said device from the off state (in which it does not conduct electric current) to the on state (in which there is conduction of electric current between the source and drain terminals).

Lateral double-diffused MOSFETs (LDMOSs) can advantageously be used in a wide range of frequencies, with powers that range from a few watts to a few hundred watts. A classic LDMOS structure comprises a substrate, which has, in lateral sectional view, a horizontal sequence constituted by a low-resistance laterally diffused area (of a P+ type, referred to as "sinker"), a source region, a gate region, and a light-doped-drain (LDD) region that provides the drain terminal. The LDD region moreover faces a surface of the substrate. Said structure of a known type forms, for obvious reasons, an elementary cell with a large pitch.

Lateral MOSs have been amply studied, and known in the literature are techniques of minimization of the internal capacitances and information on how to obtain values of drain-to-source on-state resistance ($R_{Ds\_ON}$) that are comparable with the values of the technology of trench field-effect transistors (also known as "trench-FETs").

FIG. 1 shows an LDMOS transistor of a known type, in particular described in U.S. Pat. No. 7,936,007. With reference to FIG. 1, represented therein is a lateral sectional view of a structure designed to minimize the pitch of the base cell of an LDMOS. In this case, an LDMOS transistor 1 includes a substrate 2, having a top surface 2a and a bottom surface 2b opposite to one another, in which an LDD region 3 extends from the top surface 2a of the substrate 2 to the bottom surface 2b (without actually reaching the bottom surface 2b). In an area corresponding to the bottom surface 2b a drain region 4 is present. The LDD region 3 is obtained by forming, starting from the top surface 2a of the substrate 2, implanted regions 5a and 5b, of an N type, self-aligned to the gate terminal 6 and interposed between two gate terminals 6 set alongside one another. A sinker region 7 extends in the substrate 2, in areas corresponding to body regions 10, underneath source regions 9. A conductive layer 8 extends above, and electrically insulated from, the gate terminal 6, and penetrates into the substrate 2 until it contacts the source region 9 and the sinker region 7.

In order to minimize the parasitic capacitance between the gate terminal 6 and the LDD region 3, the structure shown in FIG. 1 may be modified in such a way that the conductive layer 8 extends over the side wall 6a of the gate terminal 6, above the LDD region 3. By connecting the conductive layer 8 to a ground reference terminal, a conductive "shield" is formed, designed to attenuate the phenomenon known as "hot-carrier injection" (HCI) and improve gate/drain decoupling. In addition, it is expedient to envisage a dielectric layer 11 in order to separate the portion of the conductive layer 8 that extends above the LDD region 3 from the top surface 2a of the substrate 2. Said dielectric layer 11 of separation preferably has a thickness in the region of 100-200 nm. A solution in this direction is the one described in U.S. Pat. No. 7,589,378 (not shown in the figure). In this case, an LDMOS transistor with LDD surface region is proposed in which a conductive shield extends over the gate terminal and alongside it, above the LDD region, and separated from the latter by means of a dielectric layer. In this way, a reduction of the electrical field is obtained with consequent benefit in terms of increase of the on-state drain-to-source resistance $R_{DS\_ON}$ and attenuation of the value of gate-to-drain capacitance. As mentioned previously, the solution with LDD surface region imposes constraints on the minimum pitch that can be obtained, which can be reduced further only at the expense of the value of breakdown voltage, which drops considerably.

As an alternative, more complex processes may be used, of the type described in U.S. Pat. No. 7,829,947, wherein a power LDMOS has a field-oxide region underneath the gate region in order to minimize the capacitance between the gate region and the LDD region. Said device, however, presents major manufacturing difficulties in order to control overlapping between the LDD region and the gate region.

BRIEF SUMMARY

Some embodiments of the present disclosure provide an LDMOS semiconductor device and a method for manufacture thereof that will be free from the drawbacks of the known art.

According to one embodiment of the present disclosure an LDMOS semiconductor device includes:

a semiconductor body having a first side and a second side opposite to one another along a first direction and including a first structural region, which faces the second side and has a first conductivity; and a second structural region which extends over the first structural region, faces the first side, and has a second conductivity opposite to the first conductivity;

a body region having the second conductivity and extending in the second structural region at the first side;

a source region having the first conductivity, extending within the body region and facing the first side;

a drain region having the first conductivity and facing the first side of the semiconductor body;

a gate electrode extending over a portion of the first side of the semiconductor body between the source region and the drain region;

a first trench which extends through the second structural region and houses a trench dielectric region and a first trench conductive region; and a second trench which extends through part of the second structural region inside the body region, said second trench housing a second trench conductive region electrically connected with the body region and with the source region.

The drain region extends through the second structural region, electrically contacts the first structural region, and is arranged between, and in direct contact with, the body region and the trench dielectric region, said first and second trench conductive regions being electrically coupled to one another.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 9-24 show, in lateral sectional views, steps for manufacturing a power device comprising two elementary cells of the type shown in FIG. 2;

FIGS. 27a-27e show a detail of embodiment of a portion of the elementary cell of FIG. 26;

DETAILED DESCRIPTION

According to the present disclosure, a power device is provided, in particular a lateral-diffusion MOS transistor (LDMOS) with drain electrode on the back of the device.

Figure 2:
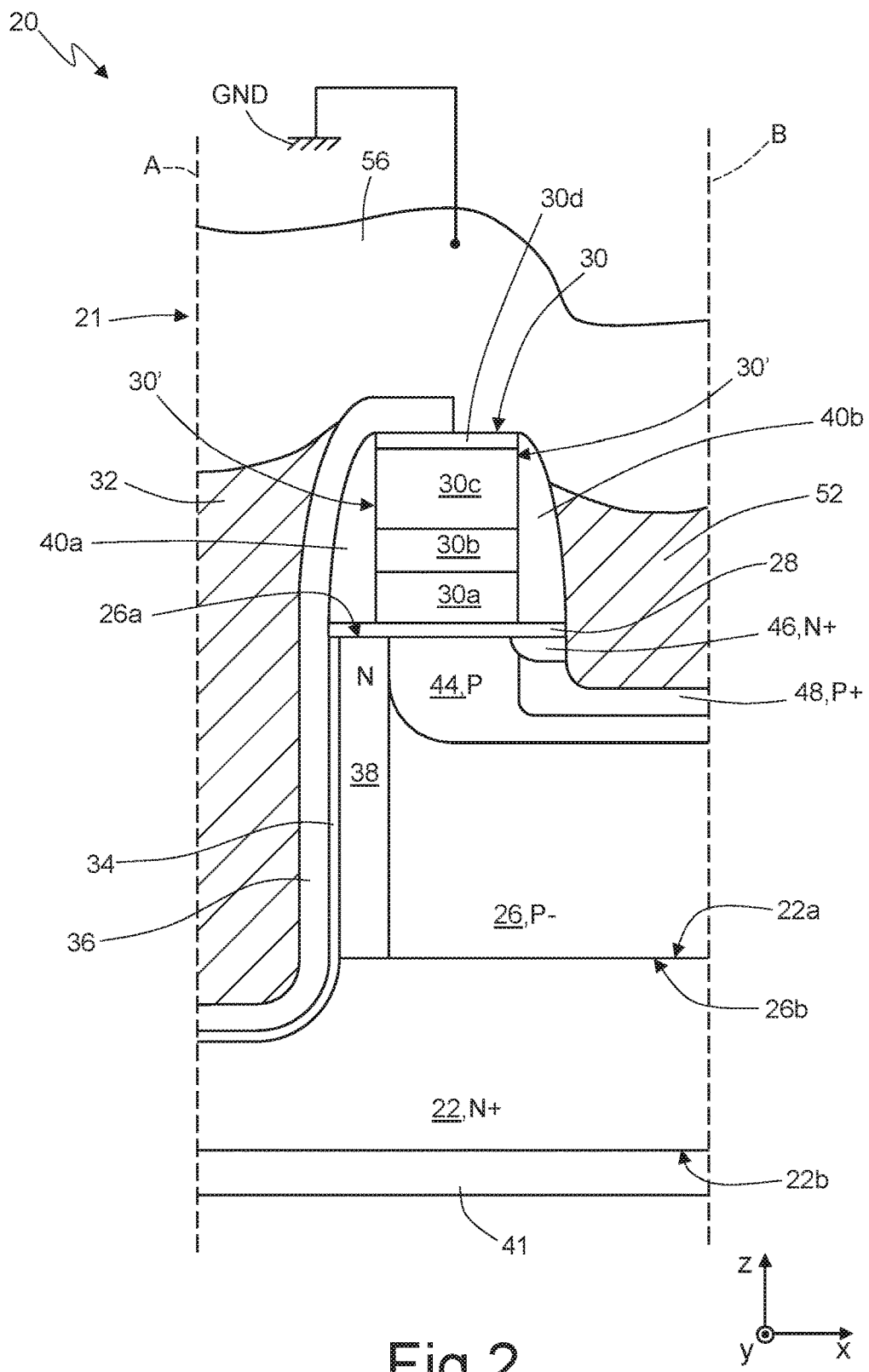
FIG. 2 shows, in lateral sectional view, an elementary cell of a power device according to one embodiment of the present disclosure.

FIG. 2 is a schematic view, in lateral section, of a portion of a power device 20. The view of FIG. 2 represents an elementary cell 21 of the power device 20. The latter may comprise just one elementary cell 21 or a plurality of elementary cells of the type shown in FIG. 2. The elementary cell 21 extends from the segment A to the segment B, and the portion comprised between A and B may be ideally replicated and then reflected specularly with respect to the segment A and/or to the segment B to obtain a power device 20 comprising a plurality of elementary cells 21.

The elementary cell 21 of FIG. 2 comprises a substrate 22, made of semiconductor material such as, for example, silicon having a first conductivity (e.g., of an N+ type). The substrate 22 is delimited by a first side 22a and by a second side 22b opposite to one another in a direction Z.

Extending over the substrate 22 is a structural region 26, for example made of silicon grown epitaxially, having a second conductivity (e.g., of a P− type), different from the first conductivity. The structural region 26 has a thickness chosen according to the need, in particular approximately 1.2 µm or 1.3 µm. It is evident that other values may be chosen, for example any value of thickness starting from 0.6 µm.

According to other embodiments, the structural region 26 has the first conductivity (e.g., of an N− type) and a value of conductivity lower than the value of conductivity of the substrate 22.

The structural region 26 is delimited by a first side 26a and by a second side 26b opposite to one another in the direction Z. The second side 26b of the structural region 26 faces the first side 22a of the substrate 22. According to one embodiment, the second side 26b of the structural region 26 is in direct electrical contact with the first side 22a of the substrate 22. According to alternative embodiments (not shown), one or more further structural regions, for example grown epitaxially and similar to the structural region 26 and/or to the region 22, extend between the first side 22a of the substrate 22 and the second side 26b of the structural region 26.

Extending over the first side 26a of the structural region 26 is a dielectric layer 28, for example made of silicon oxide, having the function of gate oxide.

A gate electrode 30 extends over the dielectric layer 28. The gate electrode 30 is formed by a stack of layers of polysilicon with N+ doping 30a, silicide 30b, insulating material 30c (e.g., silicon oxide), and silicon nitride 30d. According to one embodiment, the silicide layer 30b is constituted by a metal layer, obtained by reaction with cobalt, or else via deposition of tungsten silicide in sequence to the polysilicon, or in any other way.

A drain region 38, having the first conductivity (of an N type), extends in the direction Z between the first side 26a of the structural region 26 and the first side 22a of the substrate 22, substantially aligned with a side wall 30' of the gate electrode 30 (or in any case overlapping to a minimal extent the gate electrode 30). In top plan view, the drain region 38 extends alongside, in the direction X, the gate electrode 30, and possibly overlaps the gate electrode, as a consequence of the steps of the manufacturing process.

A trench 31 extends in depth in the direction Z, in the structural region 26, and in part of the substrate 22, and terminates in the substrate 22. A first trench conductive region 32 extends inside the trench 31 and is surrounded by one or more dielectric layers (in FIG. 2 a first trench dielectric 34 and a second trench dielectric 36 are illustrated).

The trench 31 extends alongside (in the direction X) the gate electrode 30 and the drain region 38. The first trench conductive region 32 is electrically insulated from the gate electrode 30 by the second trench dielectric 36 (and, as described more fully hereinafter by a further dielectric designated in the figure by the reference number 40a). In addition, the first trench conductive region 32 is electrically insulated from the drain region 38 by the first and second trench dielectrics 34, 36. Moreover, the first and second trench dielectrics 34, 36 insulate electrically the first trench conductive region 32 from the substrate 22.

Hence, both the first and the second trench dielectrics 34, 36 are designed to insulate electrically the first trench conductive region 32 from the structural region 26 and from the substrate 22, whereas the second trench dielectric 36 and the dielectric 40a are designed to insulate electrically the first trench conductive region 32 from the gate electrode 30.

The first trench conductive region 32 forms an electrode, which can be connected to a reference voltage GND (e.g., connected to ground) designed to reduce the electrical field, and hence generation of hot electrons in the drain region 38, in particular in areas corresponding to the portion of the drain region 38 that extends in the proximity of the gate electrode 30. This enables a good control (in particular, a reduction) of the phenomena of charge trapping or injection (known as "hot-carrier injection") in the drain region 38. The distance between the first trench conductive region 32 and the drain region 38 may be adjusted by choosing appropriately the thickness of the first and second trench dielectrics 34, 36.

The present applicant has found that a thin trench dielectric (for example in the range of approximately 50-200 nm, extremes included) makes it possible to approach the first trench conductive region 32 to the drain region 38, with consequent reduction of the electrical field (potential lines) in the portion of the structural region 26 in which the drain region 38 faces the gate electrode 30. This leads, as has been said, to the advantage that the phenomenon of generation of hot electrons is minimal even at high doping concentrations of the drain region 38.

Moreover, this enables an optimal compromise to be achieved between control of the aforementioned electrical field and the dose of doping of the LDD region, which, if increased as compared to the solutions of a known type, enables reduction of the drain-to-source on-state resistance $R_{DS\_ON}$.

Formation of the drain region 38 will be described more fully hereinafter, and is obtained place via slanted implantation, where the angle is chosen such a way that the drain region 38 thus formed extends between the first side 26a and the second side 26b of the structural region 26, substantially adjacent to the first trench dielectric 34, and is in electrical contact with the substrate 22.

At the second side 22b of the substrate 22 a first metallization 41 is present, in electrical contact with the substrate 22. In use, the drain region 38, the substrate 22, and the first metallization 41 form a drain electrode of the power device 20.

The elementary cell 21 of FIG. 2 further comprises lateral spacers 40a, 40b (made of dielectric material), which extend along side walls 30' of the gate electrode 30. In particular, the lateral spacer 40a extends between the gate electrode 30 and the second trench dielectric 36, above the drain region 38 and substantially aligned, in the direction Z, with the drain region 38. The lateral spacer 40a has a maximum extension, measured in a direction X orthogonal to the direction Z, comprised between approximately 100 nm and 200 nm. Said maximum extension is present at the interface between the lateral spacer 40a and the dielectric layer 28 on which the lateral spacer 40a lies. The spacer 40b has a shape similar to that of the spacer 40a and extends in areas corresponding to the wall 30' opposite, in the direction X, with respect to the wall 30' along which the spacer 40a extends. The spacers 40a and 40b are made of dielectric material, for example silicon oxide.

The elementary cell 21 of FIG. 2 further comprises a body region 44, having the second conductivity (of a P type), which extends in the structural region 26 facing the first side 26a. In greater detail, the body region 44 extends in the structural region 26 for a depth in the direction Z equal, for example, to approximately 0.5 or 0.6 µm; moreover, the body region 44 borders laterally (i.e., in the direction X) on a portion of the drain region 38.

In addition, a source region 46 extends in the body region 44, facing the first side 26a of the structural region 26, for a depth in the direction Z comprised, for example, between approximately 100 nm and 150 nm. The source region 46 has the first conductivity (e.g., of an N+ type) and overlaps, in top plan view, to the gate electrode 30 by an amount, measured along the axis X, comprised for example between approximately 0.05 µm and 0.15 µm.

In use, the portion of the body region 44 comprised between the source region 46 and the drain region 38 houses the conductive channel of the power device 20.

An enriched region 48 (p-well), having the second conductivity and a value of doping higher than that of the body region 44 (e.g., P+, with a concentration of around $1 \cdot 10^{18}$ cm$^{-3}$), extends in the body region 44 underneath the source region 46 (i.e., substantially vertically aligned to the source region 46 in the direction Z). The enriched region 48 has the function of reducing, in use, the sheet resistance of the body region 44, which is located underneath the source region 46, so as to prevent turning-on of a parasitic bipolar transistor in the avalanche multiplication during breakdown.

The elementary cell 21 of FIG. 2 further comprises a second trench 51, housing a second trench conductive region 52, which extends in the body region 44 through the dielectric layer 28, in an area corresponding to the source region 46 and the enriched region 48, terminating inside the enriched region 48. The second trench conductive region 52 is hence in electrical contact with the source region 46 and with the enriched region 48. In this way, the source region 46 and the body region 44 are both electrically coupled to the trench conductive region 52 and, via the latter, are electrically coupled together.

The second trench conductive region 52 is moreover electrically separated from the gate electrode 30 by the spacer 40b.

A second metallization 56 extends over the first trench conductive region 32, the second trench conductive region 52, and the gate electrode 30, in electrical contact with the first trench conductive region 32 and the second trench conductive region 52, and electrically insulated from the gate electrode by the silicon-nitride layer 30d and the dielectric layer 30c.

In this way, via the second metallization 56, the body region 44 and the source region 46 are electrically coupled to the first trench conductive region 32.

In use, according to one embodiment of the present disclosure, the second metallization 56 is biased at a reference voltage GND (for example, ground).

The present applicant has found that lowering the parasitic capacitance $C_{GD}$ between the gate electrode 30 and the drain region 38, more effectively decouples the gate electrode 30 electrically from the drain region 38. According to the embodiment of FIG. 2, the gate electrode 30 is electrically decoupled from the drain region 38 via the body region 44. According to one aspect of the present disclosure, in use, the body region 44 is biased at the reference voltage GND via the second trench conductive region 52 and the second metallization 56. The drain region 38, as has been said, is of a vertical type and extends in the structural region 26 along Z; likewise, also the first trench conductive region 32 extends vertically along Z in the structural region 26, and borders laterally (along X) on the drain region 38. According to the structure described, the only contributions at the basis of electrical coupling between the gate electrode 30 and the drain region 38 are: (i) electrical coupling due to the overlapping portion between the drain region 38 and the gate electrode 30, through the insulating layer 28; and (ii) electrical coupling due to the interaction between the side wall 30' of the gate electrode 30 and the drain region 38.

Figure 1:
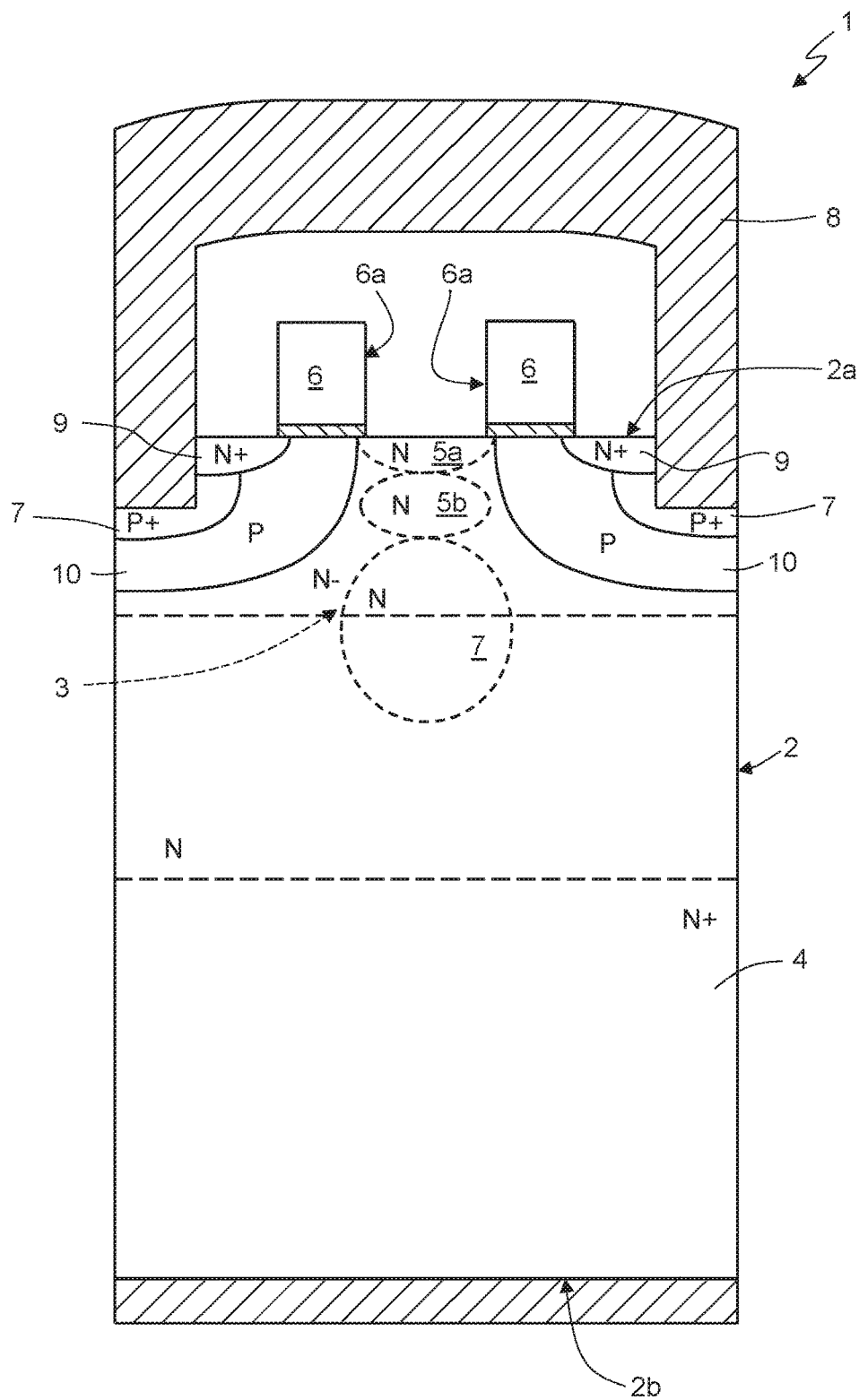
FIG. 1 illustrates, in lateral sectional view, a MOSFET device according to an embodiment of a known type.
Figure 3:
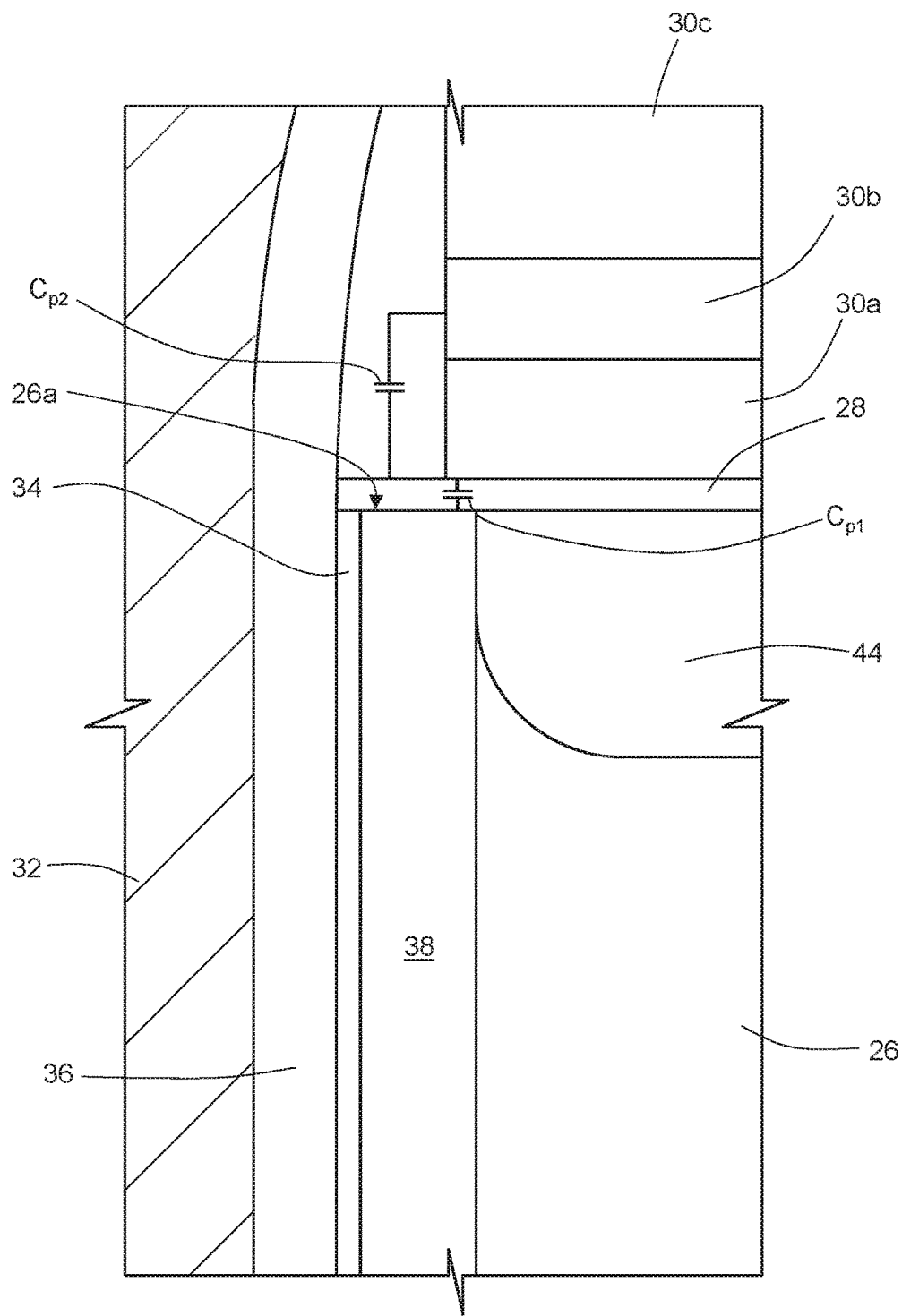
FIG. 3 shows an enlarged detail of the cross section of the power device of FIG. 2.

FIG. 3 shows an enlarged detail of the portion of the elementary cell 21 of FIG. 1 that houses the parasitic capacitances $C_{P1}$ and $C_{P2}$ at the basis of the aforementioned contributions (i) and, respectively, (ii) of the electrical coupling between the gate electrode 30 and the drain region 38. It should moreover be noted that the surface portion of the drain region 38 that interacts with the aforesaid side wall 30' of the gate electrode 30 is the one that extends for a length, along X, equal to that of the base of the spacer 40a.

Some applications desire threshold voltages of the power device 20 ranging between 1 V and 2 V. This entails the use of low concentrations of P doping of the body region 44 (around $5\cdot10^{16}$-$2\cdot10^{17}$ cm$^{-3}$) when thick gate oxides are used (in the region of 40-60 nm; in FIG. 2 the gate oxide is represented by the dielectric layer 28). Instead, when thin gate oxides are used (in the region of 30-40 nm), high concentrations of P doping of the body region 44 are used (around $2\cdot10^{17}$-$5\cdot10^{17}$ cm$^{-3}$). The solutions with thick gate oxide enable reduction of the contribution of the gate-to-drain capacitance $C_{GD}$ due to the overlapping between the drain region and the gate electrode. At the same time, said solutions require gate dimensions in the region of 0.5 μm-0.6 μm (gate width W, i.e., measured along X between the drain region 38 and the source region 46) in order to prevent the "punch-through" phenomenon. Thin gate oxides enable scaling of the dimensions and can be accompanied by an increase of dose of doping of the body region 44.

Figure 4:
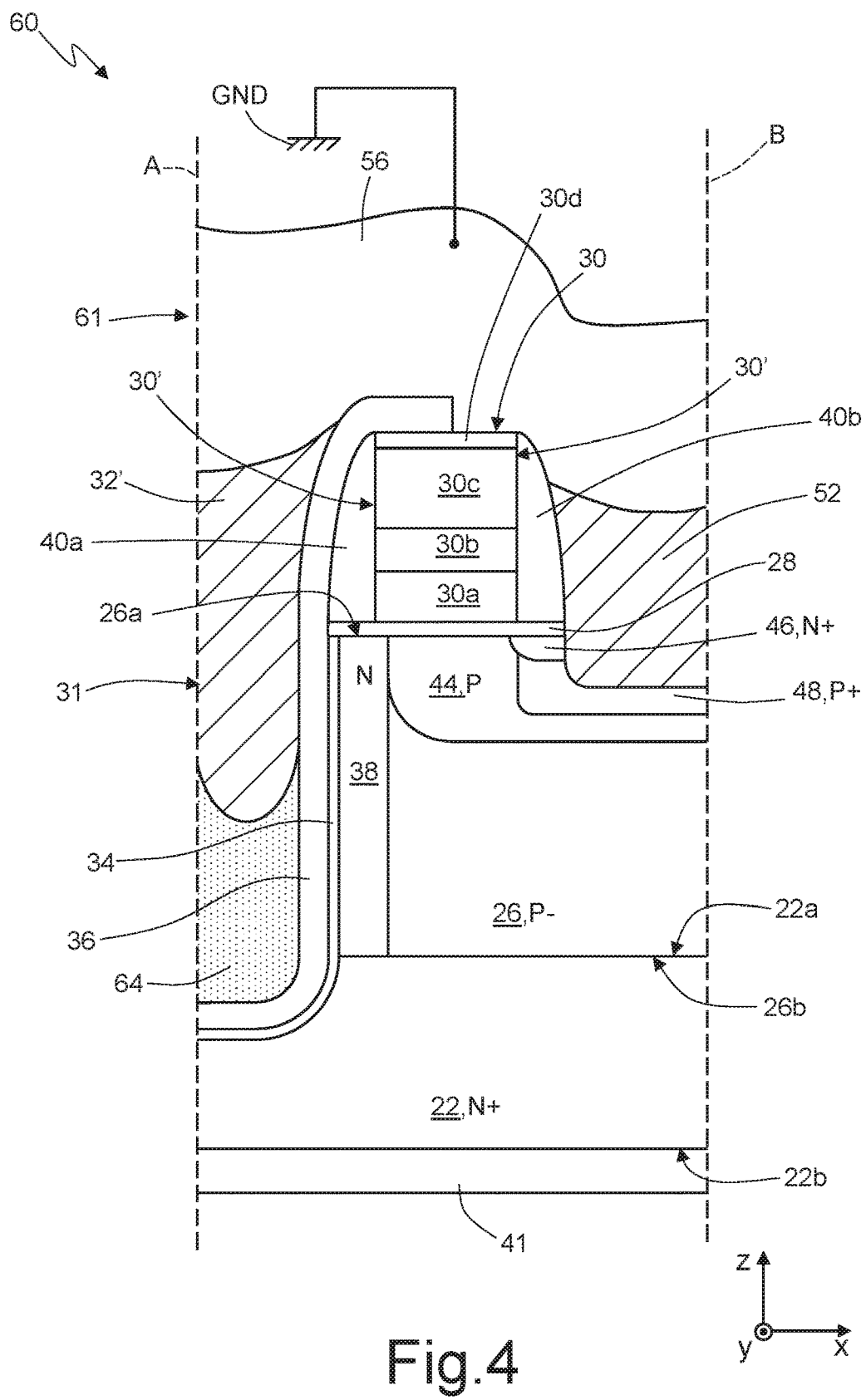
FIG. 4 shows, in lateral sectional view, an elementary cell of a power device according to a further embodiment of the present disclosure.

FIG. 4 shows an elementary cell 61 of a power device 60 according to an embodiment alternative to that of FIG. 2. Elements of the elementary cell 61 that are in common to those of the elementary cell 21 of FIG. 2 are designated by the same reference numbers and are not described any further.

According to the embodiment of FIG. 4, the first trench conductive region 32' of the elementary cell 61 is similar to the first trench conductive region 32 of the elementary cell 21 of FIG. 2, but extends in the structural region 26, in the direction Z, until it reaches a depth smaller than the thickness, measured along Z starting from the first side 26a, of the structural region 26. For example, the first trench conductive region 32' of the elementary cell 61 extends to a depth along Z substantially equal to approximately half of the thickness of the structural region 26. Extending underneath the first trench conductive region 32', and in contact with the latter, is a filling region 64, made of a dielectric material or of a number of dielectric materials in layers set on top of one another, for example silicon nitride and/or silicon oxide. Both the first trench conductive region 32' and the filling region 64 are surrounded by the second trench dielectric 36. In this way, the first trench conductive region 32' of FIG. 4 extends in the power device 60 until it reaches a maximum depth smaller than the maximum depth reached by the first trench conductive region 32' of the power device 20 of FIG. 2. The reduction of the depth reached by the first trench conductive region 32' of the power device 60 (which, as has been said, in use, is biased at a reference voltage GND, typically ground) attenuates the field-plate effect on the drain region 38 (i.e., it worsens the capacity of reducing the electrical field in the proximity of the portion of the drain region 38 that faces the gate electrode 30), but affords the advantage of a lower output capacitance as compared to the power device 20 of FIG. 2.

Figure 5:
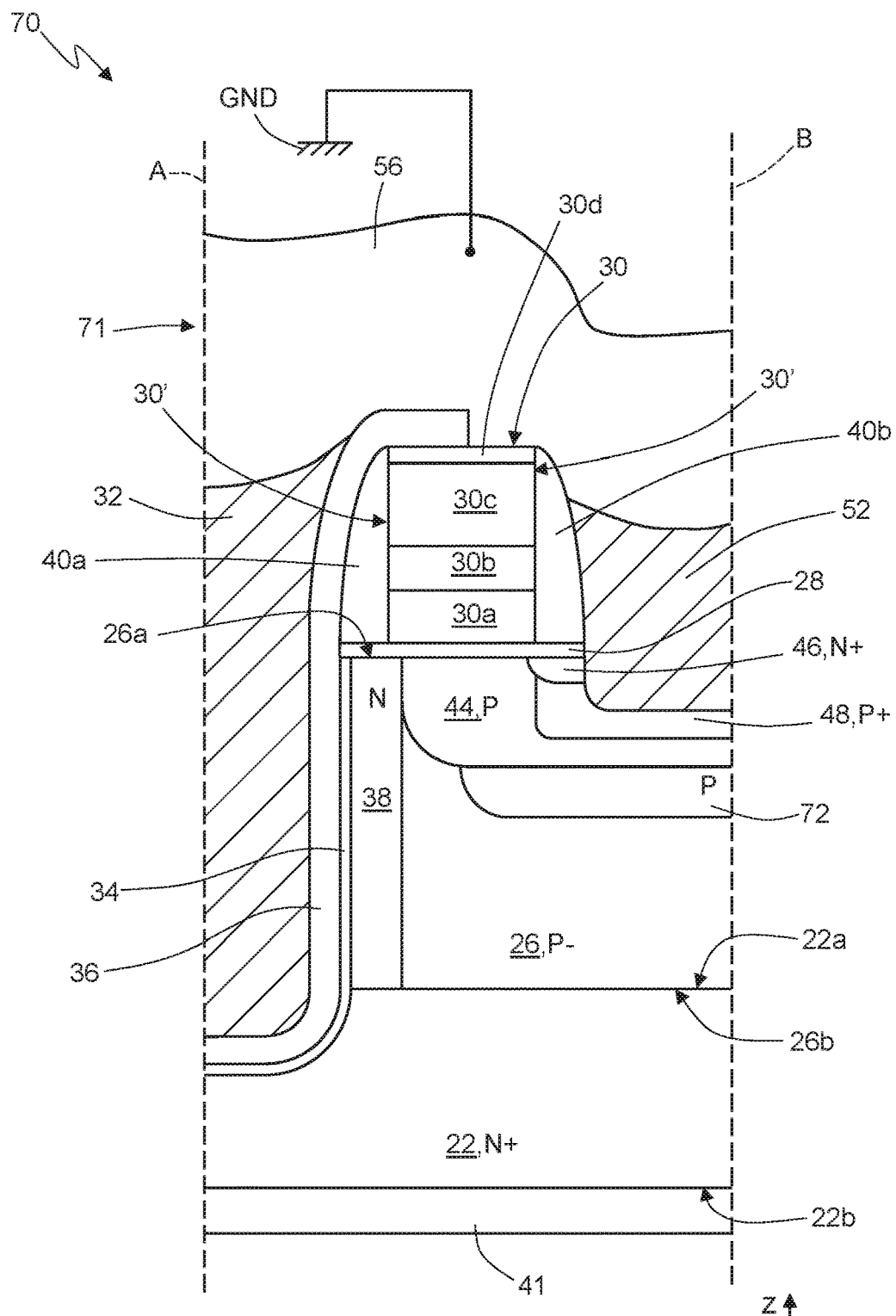
FIG. 5 shows, in lateral sectional view, an elementary cell of a power device according to a further embodiment of the present disclosure.

FIG. 5 shows an elementary cell 71 of a power device 70 according to a further embodiment of the present disclosure. Elements of the elementary cell 71 that are in common with those of the elementary cell 21 of FIG. 2 are designated by the same reference numbers and will not be described any further.

The elementary cell 71 of FIG. 5 further comprises a buffer region 72, having the second conductivity (e.g., of a P type), which extends in the structural region 26 underneath, and in electrical contact with, the body region 44. The buffer region 72 is obtained, for example, by means of an implantation of dopant species. The doping concentration is, according to one aspect of the present disclosure, of around $1\cdot10^{17}$-$2\cdot10^{17}$ cm$^{-3}$. The extension in the direction X of the buffer region 72 is equal to or smaller than the extension, once again along X, of the body region 44. The presence of the buffer region 72 enables reduction of the short-channel effects (SCEs), such as, for example, the decrease in threshold voltage and punch-through, and moreover improves the effectiveness of the superjunction.

Figure 6:
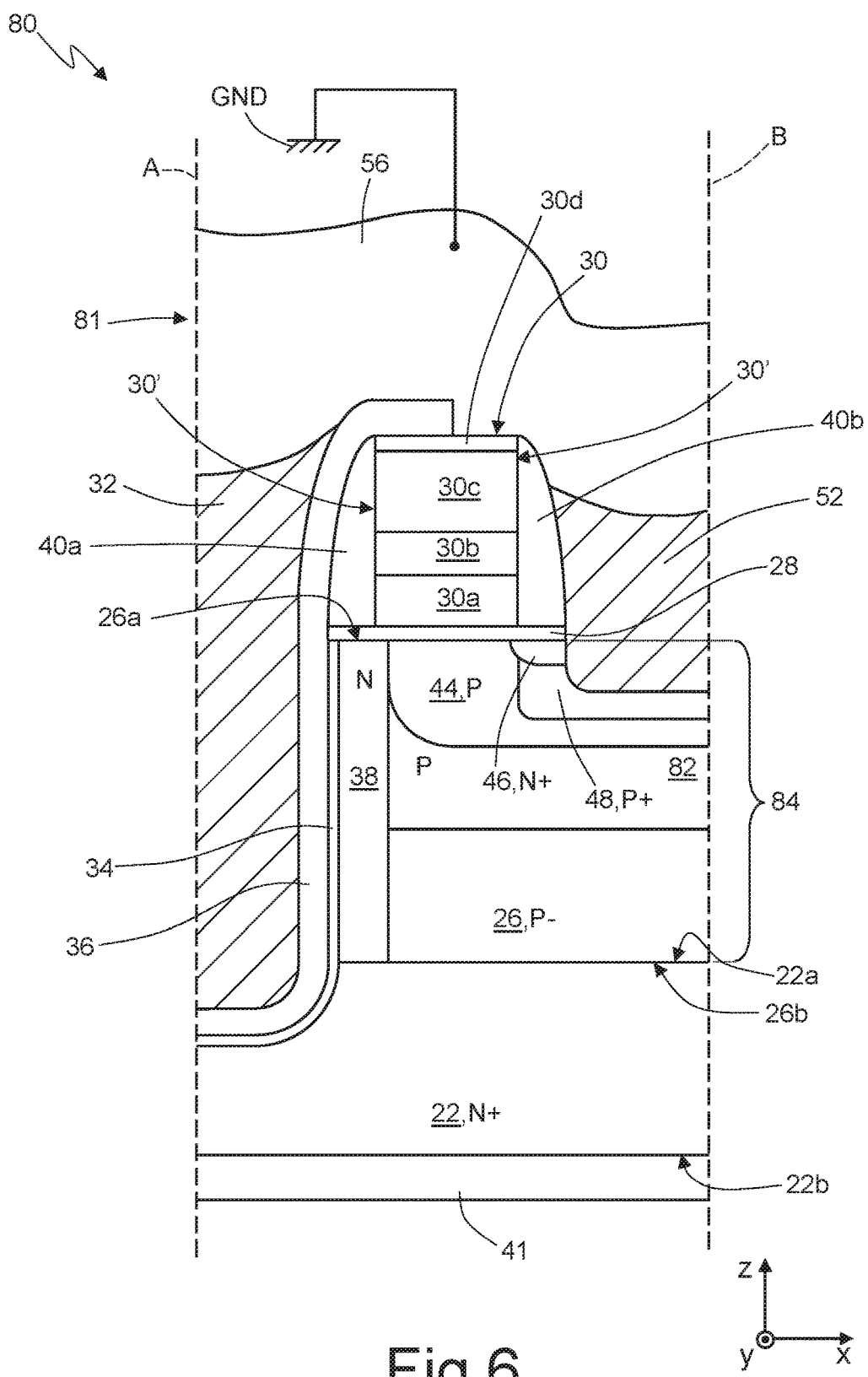
FIG. 6 shows, in lateral sectional view, an elementary cell of a power device according to a further embodiment of the present disclosure.

FIG. 6 shows an elementary cell 81 of a power device 80 according to an embodiment alternative to that of FIG. 5. Elements of the elementary cell 81 that are in common with those of the embodiments of FIGS. 2-5 are designated by the same reference numbers and are not described any further. In this case, a buffer region 82 is obtained by epitaxial growth of a buffer layer having the second conductivity (e.g., of a P type) and doping concentration, for example, of around $1\cdot10^{16}$-$1\cdot10^{17}$ cm$^{-3}$. The elementary cell 81 hence comprises the structural region 26, which extends over the substrate 22, and the buffer region 82, which extends over the structural region 26. The body region 44, the source region 46, and the enriched region 48 extend in the buffer region 82. The structural region 26 and the buffer region 82 form together a structural layer 84. Also in this case, the presence of the buffer region 82 enables reduction of the short-channel effects and improves the effectiveness of the superjunction.

Figure 7:
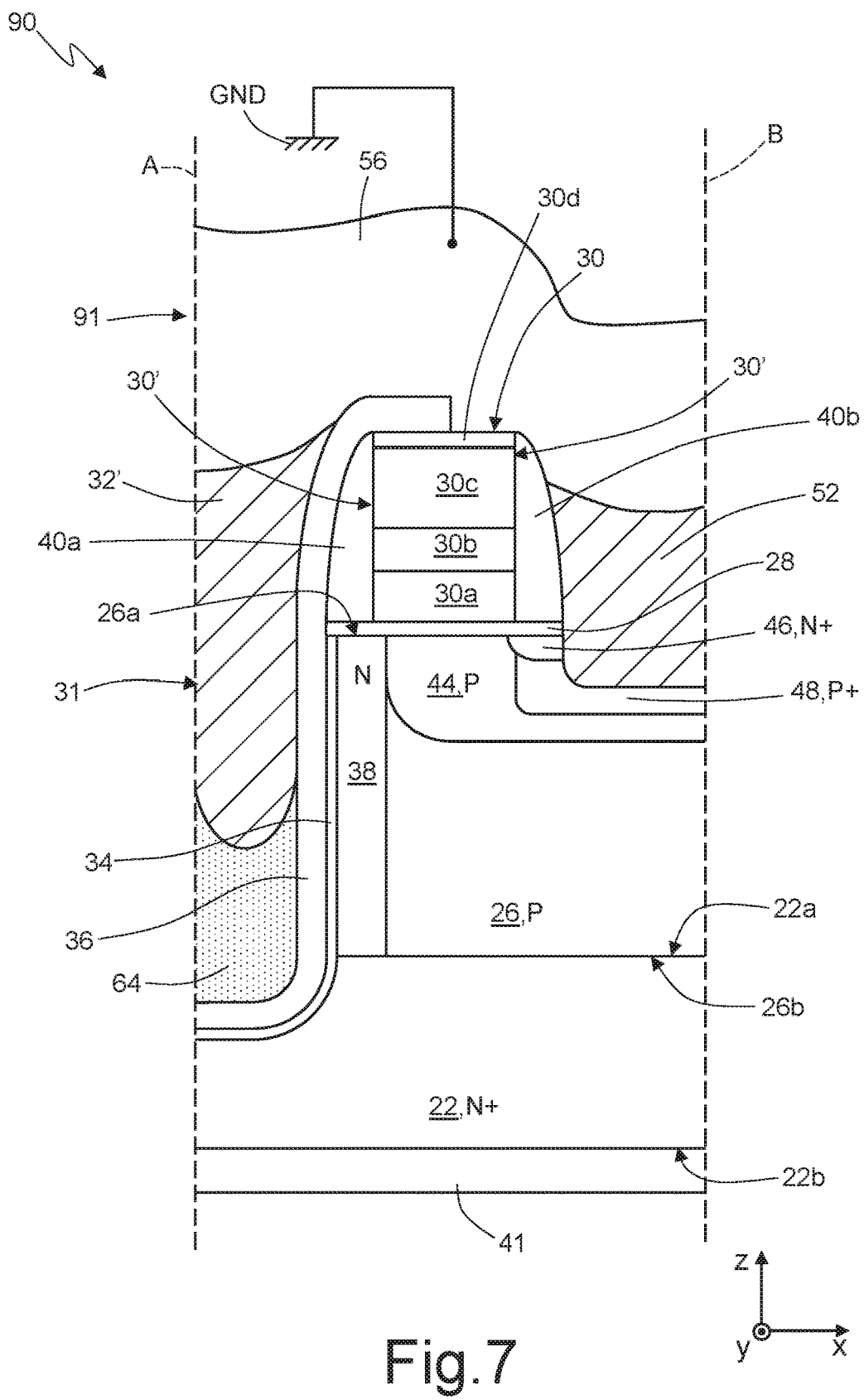
FIG. 7 shows, in lateral sectional view, an elementary cell of a power device according to a further embodiment of the present disclosure.

FIG. 7 shows an elementary cell 91 of a power device 90 according to a further embodiment. Elements of the elementary cell 91 that are in common with those of the embodiments of FIGS. 2-6 are designated by the same reference numbers and are not described any further. In this case, the structural region 26 has the second conductivity (e.g., of a P type), with a doping concentration of around $5\cdot10^{15}$-$2\cdot10^{16}$ cm$^{-3}$. In this embodiment it is hence the structural region 26 itself that has also the function of buffer region, in a way similar to what has been described with reference to FIGS. 5 and 6. The elementary cell 91 of FIG. 7 moreover has a first trench conductive region 32' similar to the first trench conductive region 32' of FIG. 4. The first trench conductive region 32' hence extends in the structural region 26, in the direction Z, until it reaches a depth smaller than the thickness, measured along Z starting from the first side 26a, of the structural region 26. The first trench conductive region 32' is electrically insulated from the structural region 26 by the first and second trench dielectrics 34, 36. According to the embodiment of FIG. 7, use of a structural region 26, having a more concentrated doping as compared to the P− concentration of the region 26 of FIGS. 2-6, enables a superjunction to be obtained even in the presence of the first trench conductive region 32' that is shallower (i.e., in use, even in the presence of an electrode at reference voltage GND, e.g., ground voltage, which does not extend throughout the thickness of the structural region 26 and of the drain region 38).

Figure 8:
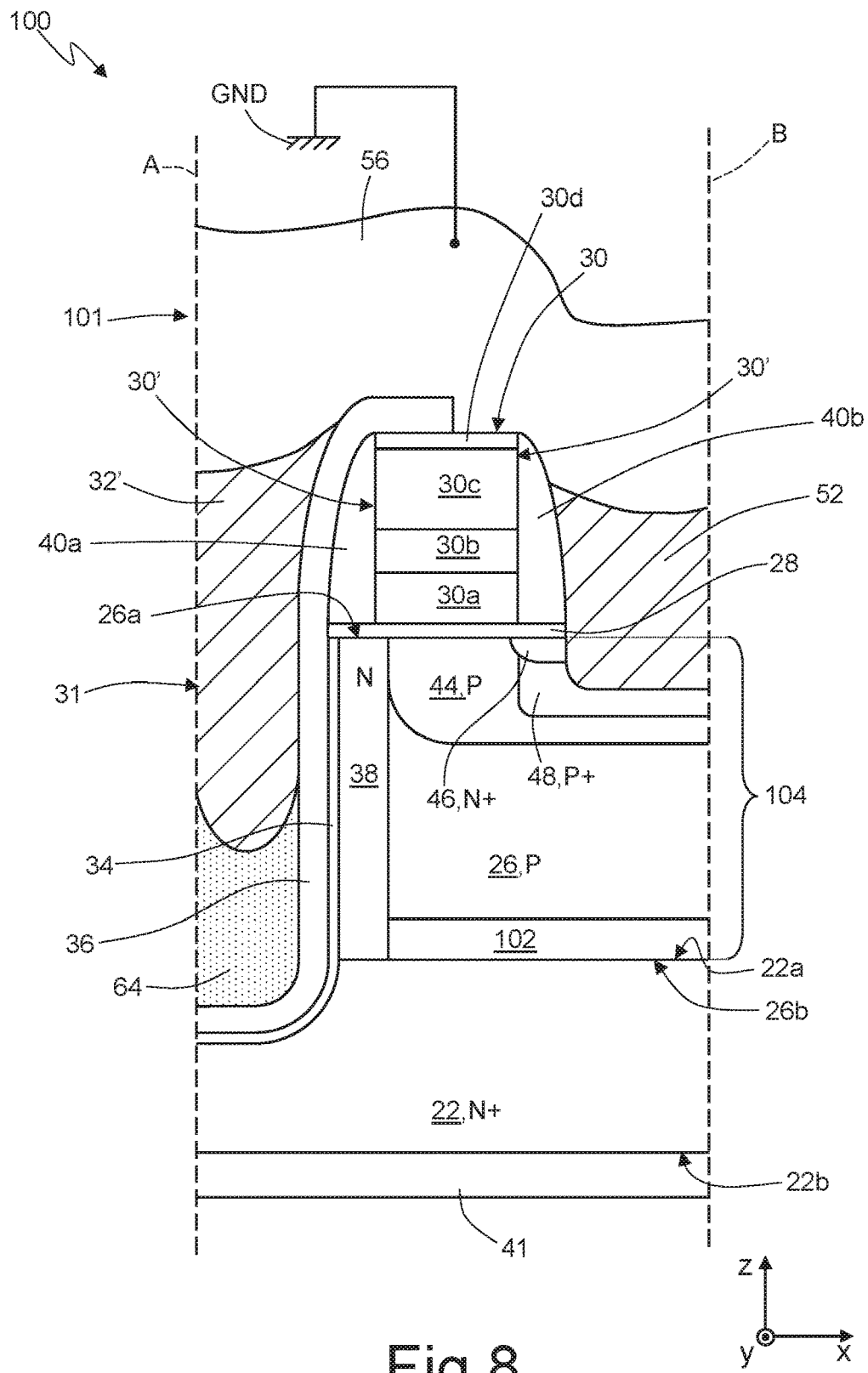
FIG. 8 shows, in lateral sectional view, an elementary cell of a power device according to a further embodiment of the present disclosure.

FIG. 8 shows an elementary cell 101 of a power device 100 according to a further embodiment. The elementary cell 101 is similar to the elementary cell 91, and elements that are in common therewith are designated by the same reference numbers and are not described any further. In particular, as described with reference to FIG. 7, the structural region 26 has the second conductivity (e.g., of a P type), and a doping concentration of around 2·10$^{16}$-5·10$^{16}$ cm$^{-3}$. The elementary cell 101 moreover has a buffer layer 102 having the first conductivity (e.g., of an N type), which extends between the substrate 22 and the structural region 26. In particular, the buffer layer 102 extends in direct contact with the first side 22a of the substrate 22. The structural region 26 and the buffer layer 102 form a structural layer 104.

The buffer layer 102 is indifferently obtained by epitaxial growth or implantation of dopant species which have the first conductivity. The doping concentration of the buffer layer 102 is of around 5·10$^{15}$-5·10$^{16}$ cm$^{-3}$. The thickness of the buffer layer 102 is, for example, comprised between 0.4 µm and 0.8 µm. The presence of the buffer layer 102 enables improvement (i.e., increase) of the value of the breakdown voltage of the power device 100.

The embodiments of FIGS. 4-8 also enable use of thin gate oxides (dielectric layer 28) (in the region of 30-40 nm), and dimensions of width W of the gate electrode 30 in the range 0.3 µm-0.4 µm, so as to reduce the value of input capacitance of the respective power device.

According to the embodiments of FIGS. 2-8, the vertical drain region 38 (having a main extension along Z) enables minimization of the pitch of the power device thus obtained. At the same time, the benefits already described with reference to the field plate, to the superjunction, and to the reduction of the capacitances inside the power device are obtained.

Irrespective of the particular embodiment, the power device according to the present disclosure presents the following advantages: the phenomena of hot-carrier injection (HCI) are negligible thanks to the implementation of a superjunction; the specific on-state resistance $R_{DS\_ON}$ has an optimized value thanks to the reduction in the value of pitch of the elementary cell and to the lateral-doping doses (LDD) used; low gate charge $Q_G$ (parasitic capacitances inside the device of low value); moreover, high versatility due to integration of a monolithic half-bridge, thanks to the drain terminal on the back.

With reference to FIGS. 9-24 manufacturing steps for producing a power device 110 are now described. The power device 110 comprises two elementary cells 21 of the type shown in FIG. 2 (modifications that are evident to the person skilled in the branch likewise enable elementary cells to be obtained according to the embodiments of FIGS. 3-8). The manufacturing steps described hereinafter may be used indifferently to produce a power device including a single cell or a plurality of elementary cells, equal to, or higher than, two.

With reference to FIG. 9, a wafer 200 is provided, including the substrate 22, made of semiconductor material, for example silicon, having the first conductivity, in this case of an N type, and doping higher than 1·10$^{19}$ cm$^{-3}$.

The substrate has the first side 22a and the second side 22b opposite to one another and substantially orthogonal to the direction Z. Formed on the first side 22a is the structural region 26, for example by epitaxial growth of silicon. The structural region 26 has, according to one embodiment, the second conductivity with a doping concentration of approximately 1·10$^{15}$ cm$^{-3}$.

According to a different embodiment, the structural region 26 has the first conductivity with a doping concentration of approximately 1·10$^{15}$ cm$^{-3}$. Doping of the structural region 26 is obtained by introducing appropriate dopant species in the reaction chamber during the epitaxial growth. Alternatively, doping of the structural region 26 is obtained by implantation of dopant species at the end of, or during, formation of the structural region 26. For example, a doping of an N type is obtained with arsenic or phosphorus, whereas a doping of a P type is obtained with boron.

Then, the dielectric layer 28 is formed, made, for example, of silicon oxide $SiO_2$. The dielectric layer 28 is formed, for example, by thermal oxidation of the structural region 26, or by deposition of dielectric material. The dielectric layer 28 has a thickness of between 30 nm and 60 nm.

The process then proceeds with formation of the stack of layers, which, in subsequent manufacturing steps, form one or more gate electrodes 30. For this purpose, formed by deposition on the dielectric layer 28 is a first intermediate layer 30a of doped polysilicon, in particular of an N type, having a thickness comprised between 300 nm and 400 nm. Then, formed on the first intermediate layer 30a is a second intermediate layer 30b, made, for example, of silicide (formed in a way in itself known, with a process of thermal reaction) or of deposited metal. The second intermediate layer 30b has a thickness comprised between 100 nm and 200 nm. The first intermediate layer 30a is the gate electrode proper, whereas the layer 30b has the function of metal electrode.

Next, formed on the second intermediate layer 30b is a third intermediate layer 30c, made of dielectric material, for example by deposition of silicon oxide $SiO_2$. The third intermediate layer 30c has, for example, a thickness comprised between 300 nm and 400 nm.

Then, formed on the third intermediate layer 30c is a fourth intermediate layer 30d, made, for example, of deposited silicon nitride. The fourth intermediate layer 30d has, for example, a thickness of between 70 nm and 140 nm, and has the function of etch-stop layer in the steps of etching of the insulating layer 36 (see the step of FIG. 22).

Next, gate electrodes 30 are defined, via masked etching. With reference to FIG. 10, formed on the wafer 200 is a photoresist mask 112, designed to protect regions of the wafer 200 in areas corresponding to which gate electrodes 30 are to be formed. One or more etches are then carried out (represented, by way of example, by arrows 114 in FIG. 10) for removing selectively the fourth, third, second, and first intermediate layers 30d-30a in areas corresponding to regions of the wafer 200 not protected by the mask 112. The etches of FIG. 10 include etches of a dry type with etching chemistries that are chosen according to the need and that typically vary according to the layer to be etched.

Then (FIG. 11), the mask 112 is removed from the wafer 200 to obtain gate electrodes 30 (two gate electrodes 30 are represented in FIG. 11). The gate electrodes 30 are separated from one another by a distance $d_1$, measured in the direction X, comprised between approximately 0.6 μm and approximately 0.8 μm.

Next (FIG. 12), the body region 44 is formed. For this purpose, formed on the wafer 200 is a mask 116, made, for example, of photoresist designed to protect the wafer 200 except for regions of the latter comprised between gate electrodes 30 facing one another in the direction X. A step of implantation of dopant species which have the second conductivity (for example, boron) is then carried out, as represented by the arrows 118 in FIG. 12. The implantation is carried out with an implantation energy of approximately 30-50 keV, which can in any case be modulated on the basis of the thickness of the dielectric layer 28 and of the desired implantation depth. An implanted region 43 is thus formed, in the structural region 26, having a lateral extension (along X) substantially equal to the distance $d_1$ (once again measured along X) between the side walls 30' that belong to different gate electrodes 30, directly facing one another.

Then (FIG. 13), a step of thermal annealing, at a temperature of between 1000° C. and 1100° C. for a time of approximately 20-40 minutes, enables diffusion of the implanted region 43 to form the body region 44. The body region 44 extends, in top plan view, between the gate electrodes 30 and underneath the gate electrodes 30.

Next (FIG. 14), formed on the wafer 200 is a photoresist mask 122, having an extension similar to that of the mask 116 of FIG. 12. The mask 122 covers the wafer 200 except for the regions of the latter comprised between walls 30' of respective gate electrodes 30 directly facing one another in order to form source regions. Then an implantation (represented by arrows 124) of dopant species (for example, arsenic or phosphorus), which have the first conductivity (N), is carried out with implantation energy of approximately 60-140 keV, to form an intermediate source region 46' facing the first side 26a of the structural region 26 and completely surrounded, on the remaining sides, by the body region 44.

Figure 15:
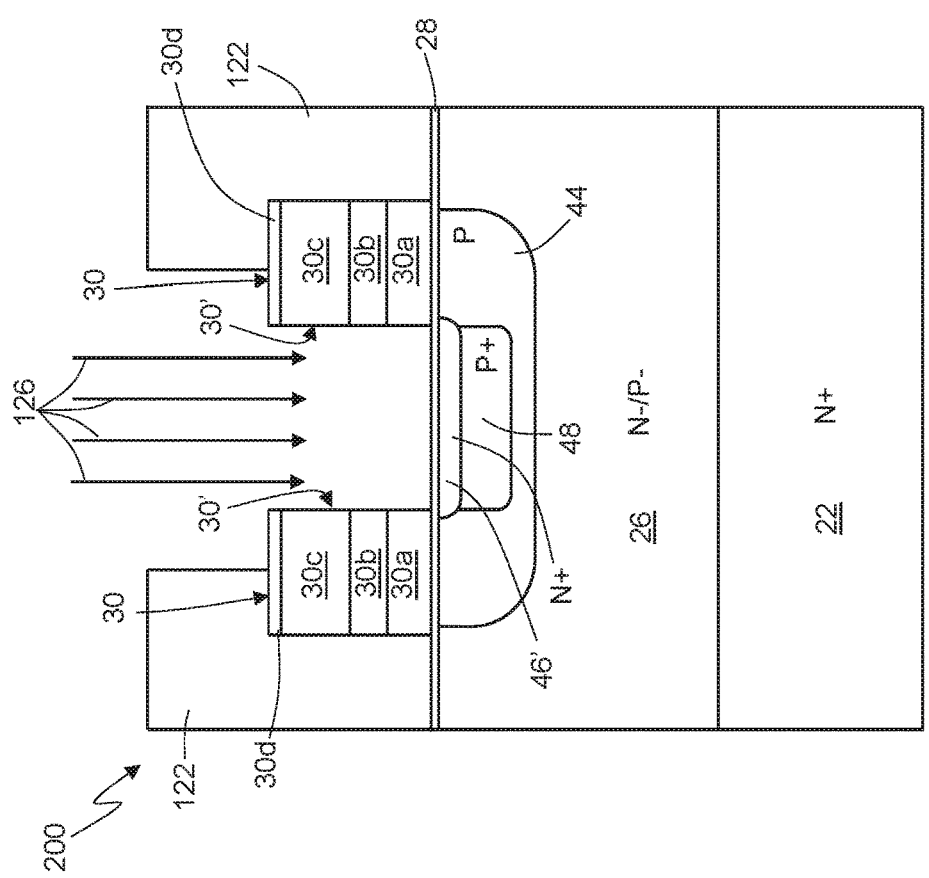

Then (FIG. 15), using the same mask 122, a further implantation of dopant species (for example, boron) which have the second conductivity (P) is carried out with implantation energy of approximately 180-240 keV, and with implantation dose of approximately $1 \cdot 10^{14}$ $cm^{-2}$. Said step is represented in FIG. 15 by arrows 126. An implanted region is thus formed that provides the enrichment region 48.

In alternative embodiments, the enrichment region 48 can be obtained with implantation carried out after formation of the spacers 40a and 40b.

The implantation energy chosen during the step of FIG. 15 is such as to obtain an implanted region 48 inside the body region 44 but extending to a depth greater than the depth of the intermediate source region 46' in such a way that the implanted region 48 is separated from the top side 26a of the structural region 26 by the intermediate source region 46'.

Then (FIG. 16), a step of deposition of dielectric material is carried out, for example, using the LPCVD or PECVD technique, on the wafer 200, for example silicon oxide $SiO_2$, having a thickness of between 100 nm and 500 nm, in particular between 100 and 200 nm. A covering dielectric layer 128 is thus formed, which covers the gate electrodes 30 and the dielectric layer 28. Next (FIG. 17), the covering dielectric layer 128 is etched with anisotropic dry etching, for example using a dry etch with etching chemistry $CF_4/CHF_3/Ar$ (HDP plasma) or else $C_2F_6/CHF_3/He$ (RIE plasma).

Said etching step is carried out so as to remove completely the covering dielectric layer 128 from the wafer 200 except for portions of the covering dielectric layer 128 adjacent to the side walls 30' of the gate electrodes 30.

Moreover, said etching step is continued until portions of the dielectric layer 28 which extend underneath the covering dielectric layer 128 are removed. The anisotropic dry etch is such that the covering dielectric layer 128 is removed at a higher rate in areas corresponding to portions of the latter orthogonal to the etching direction, whereas portions of the covering dielectric layer 128 substantially longitudinal to the etching direction (for example, the portions of the covering dielectric layer 128 that extend along the side walls 30' of the gate electrodes 30) are removed at a lower rate. Along the side walls 30' of the gate electrodes 30, spacers 40a and 40b are thus formed, which have a substantially triangular shape, or a shape tapered along Z such that the lateral thickness, measured along X, of the spacers 40a, 40b, decreases starting from the top side 26a of the structural region 26. In particular, the spacers 40a, 40b have a base side having a thickness, measured along X, equal to approximately the thickness chosen for the covering dielectric layer 128 (e.g., between 100 and 200 nm).

Moreover, the spacers 40a, 40b protect, during the previous etching step, portions of the dielectric layer 28 that extend underneath them, which are thus not removed.

Then (FIG. 18), deep trenches 132 are formed, which extend completely through the structural region 26 and through part of the substrate 22 alongside the gate electrodes 30 (in particular, at the side of the gate electrodes that does not border on the intermediate source region 46').

The trenches 132 are formed by anisotropic etching of the structural region 26 and of the substrate 22. According to one embodiment, an etching of a DRIE type is used.

Figure 18:
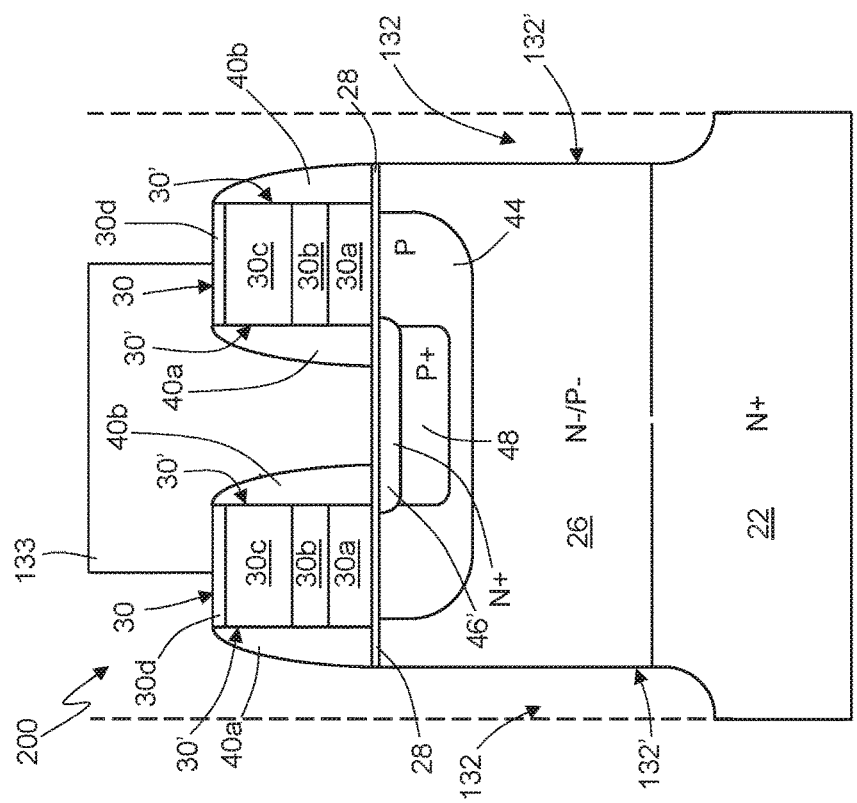

In order to protect the intermediate source region 46' from the etch, a photoresist mask 133 is formed in an area corresponding to the intermediate source region 46', between the gate electrodes 30. With reference to FIG. 18, the spacer 40a adjacent to the gate electrode 30 on the left, and the spacer 40b adjacent to the gate electrode 30 on the right function as further alignment masks for the trenches 132, such that the trenches 132 have a respective portion of the respective inner wall 132' vertically aligned (along Z) with the respective spacers 40a, 40b.

Then (FIG. 19), the mask 133 is removed, and the wafer 200 is subjected to RTO (rapid thermal oxidation) at a temperature of approximately 1000° C. for 30-60 s, in order to grow thermally an oxide layer on the non-protected portions of the wafer 200. In this way, the trench-dielectric layer 3 (or trench-oxide layer), having the function of pre-implantation oxide, is formed in regions corresponding to the respective inner walls 132' of the trenches 132. Moreover, since also the first side 26a of the structural region 26 that the intermediate source region 46' faces is exposed, a thermal-oxide layer is formed on the intermediate source region 46'.

Then (FIG. 20), a step of implantation of dopant species having the first conductivity (N) is carried out to form drain regions 38. The implantation is represented schematically in FIG. 20 by arrows 139 and 140.

Figure 20:
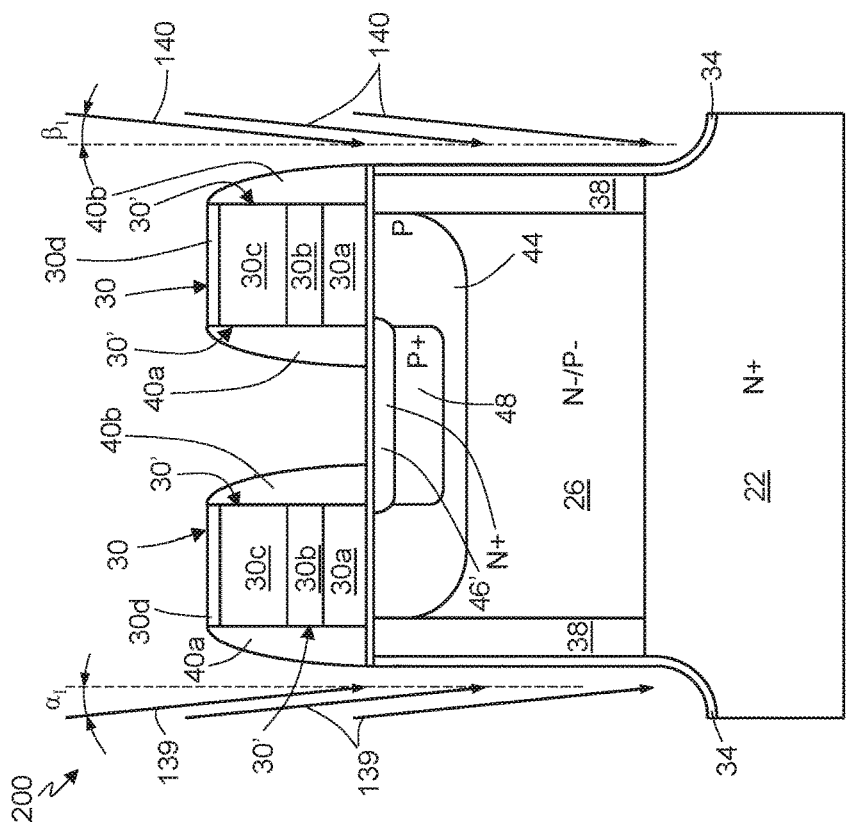
Figure 19:
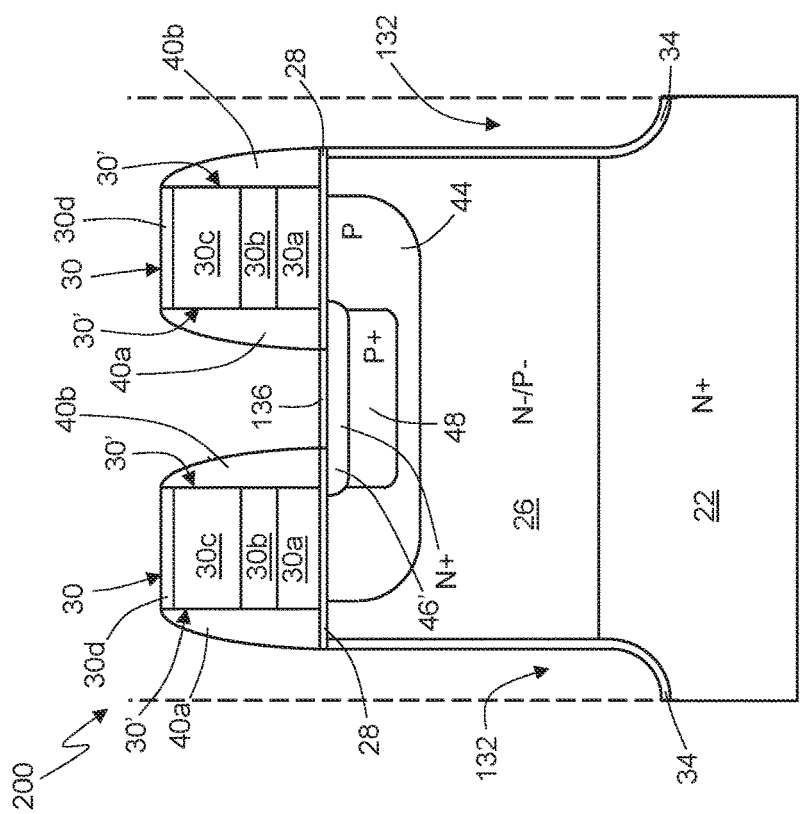

The step of implantation of FIG. 20 comprises an implantation of dopant species of an N type (e.g., phosphorus or arsenic), with implantation energy comprised between 100 keV and 300 keV, implantation angle $\alpha_I$ comprised between −15° and −10° (measured with respect to the direction Z), and implantation doses of a value comprised between approximately $1 \cdot 10^{13}$ cm$^{-2}$ and approximately $5 \cdot 10^{13}$ cm$^{-2}$. An implanted region is thus obtained, which, in subsequent manufacturing steps, forms the drain region 38 illustrated on the left of the portion of device of FIG. 20. Likewise, by carrying out an implantation of dopant species of an N type with implantation angle $\beta_1$ comprised between +10° and +15° (measured with respect to the direction Z) and implantation doses ranging between approximately $1 \cdot 10^{13}$ cm$^{-2}$ and approximately $5 \cdot 10^{13}$ cm$^{-2}$, an implanted region is obtained, which, in subsequent manufacturing steps, forms the drain region 38 illustrated on the right of the portion of device of FIG. 20.

Then, a step of thermal annealing is carried out to favor diffusion of the implanted dopant species (e.g., at 1000° C. for 30 s). In this step, there is also the diffusion of the dopant species implanted in the previous steps (e.g., during the steps of FIGS. 14 and 15). The drain regions 38 are thus obtained, which have, according to a non-limiting embodiment, a level of doping ranging between approximately $1 \cdot 10^{17}$ cm$^{-3}$ and approximately $6 \cdot 10^{17}$ cm$^{-3}$.

Then (FIG. 21), the trenches 132 are partially filled with a further dielectric layer, which provides the second trench dielectric 36. The second trench dielectric 36 is formed by means of a step of deposition of dielectric material, for example, silicon oxide or silicon nitride, on the wafer 200. A subsequent masked-etching step, shown in FIG. 22, enables removal of the non-desired dielectric layer from the wafer 200 except for the areas protected by a mask 145. The mask 145, made, for example, of photoresist, is formed in areas corresponding to the trenches 132 and protects the wafer 200 except for the surface portion of the latter that extends between adjacent gate electrodes 30, i.e., over the intermediate source region 46'. The step of etching of the wafer 200 continues for removal of the dielectric layer 28' that extends over the intermediate source region 46' between the gate electrodes 30, and for removal of a portion of the structural region 26 to form a trench 152. The trench 152 extends through the intermediate source region 46' and terminates inside the enriched region 48. The trench 152 defines two source regions 46. In other words, the source regions 46 are separated from one another by the trench 152.

Figure 23:
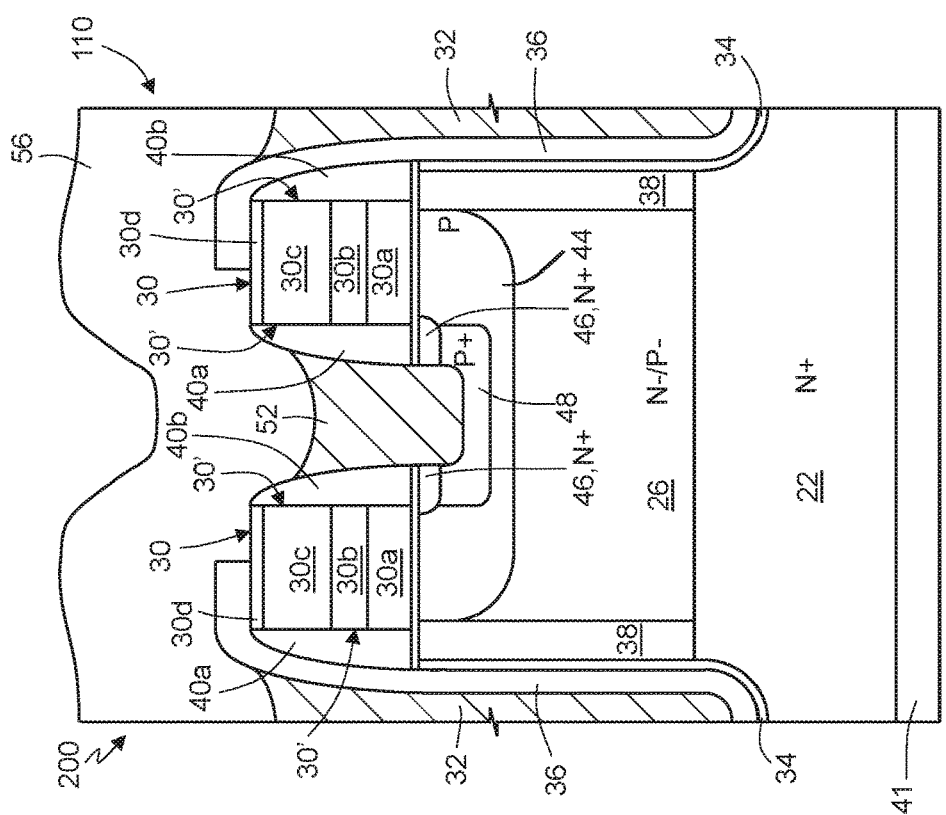
Figure 24:
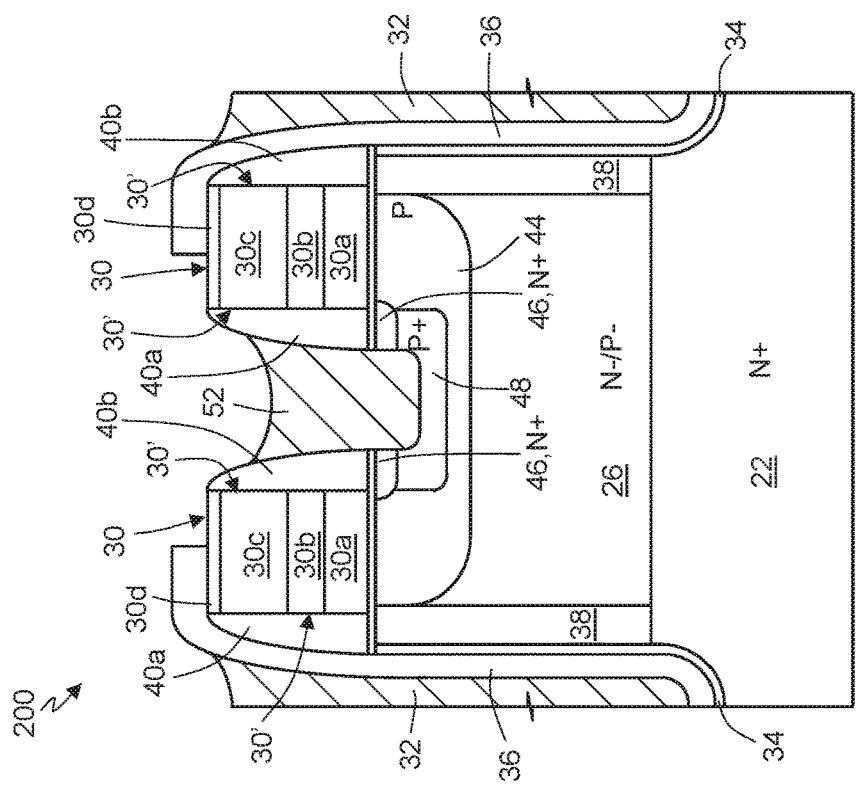

With reference to FIG. 23, the trenches 132 and the trench 152 are filled with conductive material, for example metal such as aluminum or tungsten. First trench conductive regions 32 are thus provided in the trenches 132 and the second trench conductive region 52 is provided in the trench 152. Then, with reference to FIG. 24, the source metallization 56 is formed by depositing conductive material, in particular metal, on the wafer 200, in particular in electrical contact with the first trench conductive regions 32 and the second trench conductive region 52. Moreover, a further step of deposition of conductive material, in particular metal, on the back of the wafer 200 (at the second side 22b of the substrate 22) enables formation of the drain metallization 41.

The embodiment of FIG. 5, in which the buffer region 72 is present, may be obtained by inserting a further step of implantation of dopant species that have the second conductivity prior to the step of implantation of the region 43 of FIG. 12 or, as an alternative, following upon the step of implantation of the region 43 of FIG. 12, or, again alternatively, after the step of thermal annealing to favor diffusion of the region 43 in order to form the body region 44. The implantation for the formation of the buffer region 72 is carried out using an implantation energy higher than the one used for the implantation of the region 43 of FIG. 12 so as to reach a greater depth in the structural region 26.

Figure 25:
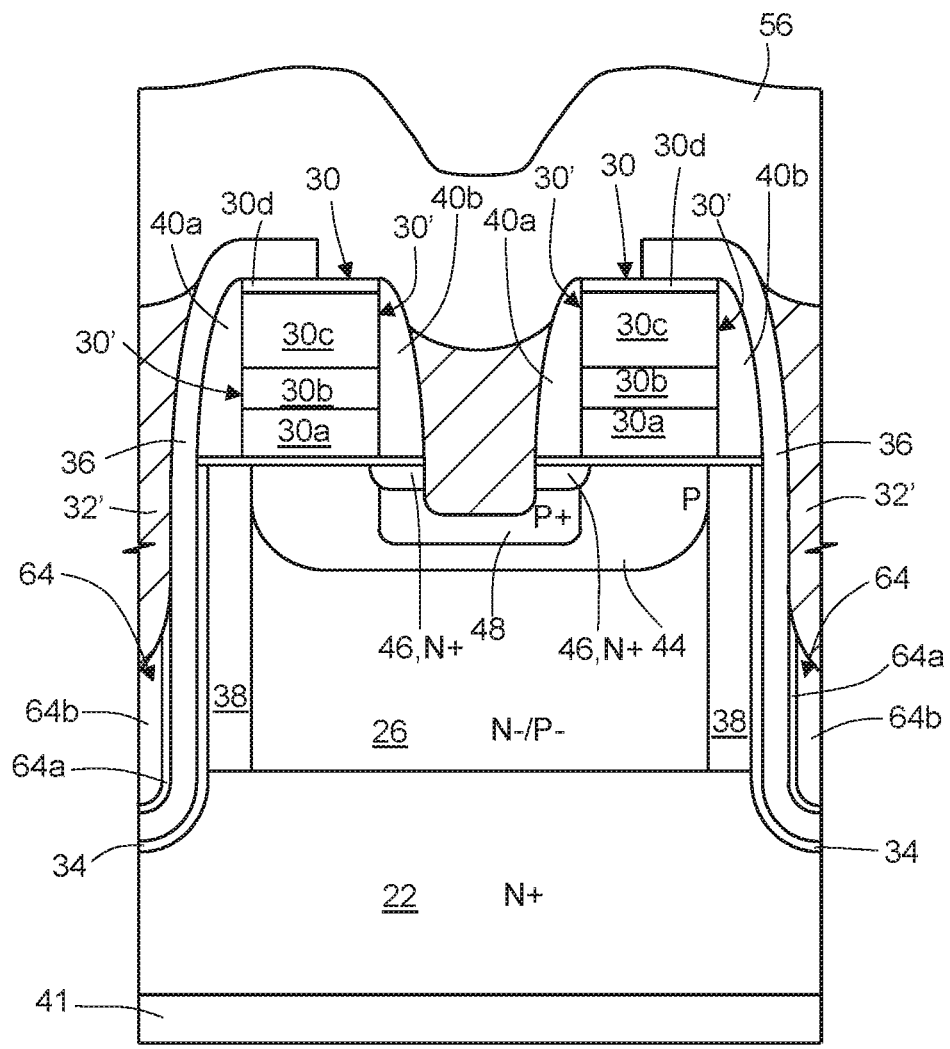
FIG. 25 shows, in lateral sectional view, an elementary cell of a power device according to a further embodiment of the present disclosure.

The embodiments of FIGS. 7 and 8, in which filling regions 64 are present, which extend on the bottom of the trenches 132, may be obtained by causing the step of FIG. 23 (deposition of conductive material for filling the trenches 132, 152) to be preceded by one or more steps of deposition of dielectric material, for example silicon nitride and silicon oxide, inside the trenches 132. According to this embodiment, shown in FIG. 25, the filling region 64 includes two filling subregions 64a and 64b of respective dielectric materials that can be etched selectively. For example, the dielectric subregion 64a is made of silicon nitride, and the dielectric subregion 64b is made of silicon oxide.

According to this embodiment, after deposition of the second trench dielectric, formed on the wafer 200 is a silicon-nitride layer having a thickness of some tens of nanometers. The silicon-nitride layer is formed by deposition of $Si_3N_4$, which penetrates in the trenches 132 to form a silicon-nitride layer on the walls and on the bottom of the trenches 132 (i.e., forming the filling subregion 64a). Then, formed on the wafer 200 is a silicon-oxide layer having a thickness of some hundreds of nanometers (e.g., 200 nm), which fills, at least partially, the trenches 132. Then, by etching selectively the silicon oxide with an etching chemistry having a high selectivity in regard to silicon nitride, the silicon oxide is removed partially inside of the trenches 132 to form the dielectric subregion 64b, which fills part of the trenches 132 (in particular, the bottom of the trenches 132). By modulating appropriately, and in a way in itself known, the duration of the etch, it is possible to remove the desired amount of silicon oxide from the trenches 132. The latter etch is moreover designed to remove the oxide layer deposited on the wafer 200 outside the trenches 132, until the underlying silicon-nitride layer (deriving from the immediately previous deposition step) is reached. Finally, said silicon-nitride layer may be removed from the wafer 200 with an etch of a standard type, without the need to resort to any photomask. Inside the trenches 132, the silicon-nitride layer is removed elsewhere, except for the areas of the latter protected by the dielectric subregion 64b. A second filling region 64 is thus formed, comprising the dielectric subregion 64a, made of silicon nitride, which surrounds laterally and at the bottom the dielectric subregion 64b, made of silicon oxide. It is thus possible to proceed with formation of the first trench conductive region 32', in the way already described previously. It is evident that the dielectric subregions 64a and 64b may be made of dielectric materials different from those indicated by way of example.

According to a further embodiment (not shown in the figure), the filling regions 64 are provided by causing the step of formation of the second trench dielectric 36 to be followed by a step of formation (e.g., deposition) of a third trench dielectric having an etching rate higher than the respective etching rate of the second trench dielectric 36. In this way, it is possible to modulate etching of the third dielectric without incurring in undesirable damage to the second trench dielectric 36. The third dielectric may, for example, be etched in such a way as to remove it only in part from the trenches 132 but completely from the rest of the wafer. The trenches 132 are thus partially filled with dielectric material in areas corresponding to their bottom.

Figure 26:
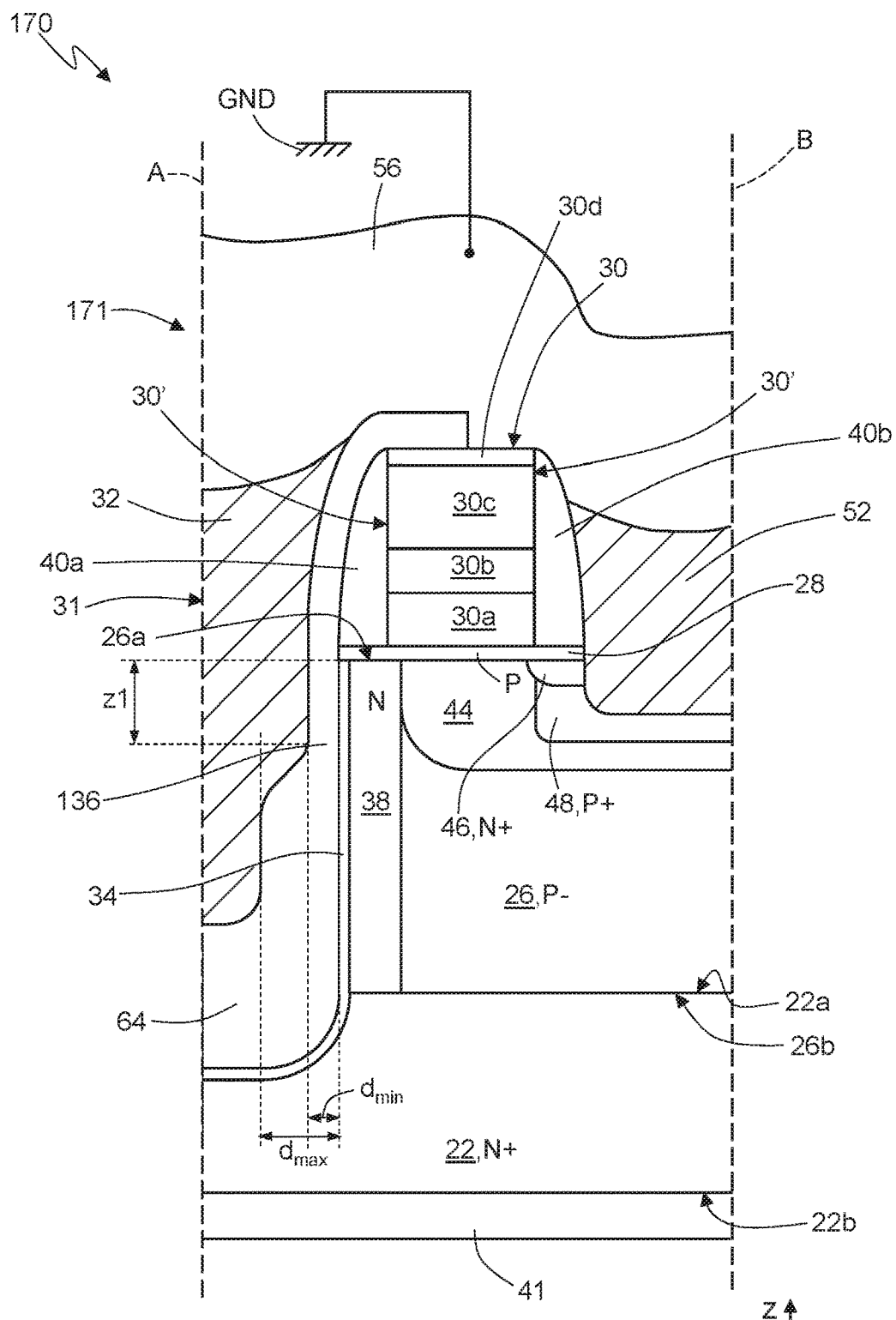
FIG. 26 shows, in lateral sectional view, an elementary cell of a power device according to a further embodiment of the present disclosure.

FIG. 26 shows a further embodiment of an elementary cell 171 of a power device 170. According to FIG. 26, in each trench 132 a trench dielectric 136 is present, which surrounds the first trench conductive region 32. The trench dielectric 136, as better illustrated in FIGS. 27a-27e comprises a plurality of dielectric layers set on top of one another. The trench dielectric 136 has a thickness, measured in the direction X starting from the wall 132' of the respective trench 132, which varies when measured at different depths (along Z). In particular, said thickness has a minimum value $d_{MIN}$ when measured substantially at the first side 26a of the structural region 26 and as far as the depth $z_1$, and a maximum value $d_{MAX}$ at a greater depth, until the bottom end of the first trench conductive region 32 is reached.

Even more in particular, the thickness (along X) of the trench dielectric 136 is equal to $d_{MIN}$ substantially as far as a depth $z_1$, measured starting from the first side 26a of the structural region 26, approximately equal to the depth reached by the body region 44. Then, beyond a depth $z_1$ in the trench 136, the thickness (along X) of the trench dielectric 136 passes, as has been said, to the maximum value $d_{MAX}$. According to this embodiment, $d_{MIN}$ is given by the sum of the thicknesses, along X, of the trench-oxide layers 34 and 36, and $d_{MAX}$ is given by the sum of the thicknesses, along X, of the trench-oxide layers 34 and 36, and thicknesses, along X, of the layers 181 and 183 (the latter are shown hereinafter in FIG. 27e, and described with reference to said figure).

Consequently, the conformation of the first trench conductive regions 32 follows the conformation of the trench dielectric 136. The first trench conductive regions 32, hence, have a thickness, in cross-sectional view and along X that is maximum when measured at the first side 26a of the structural region 26, and minimum when measured at the bottom end of the first trench conductive region 32.

Steps of formation of the trench dielectric 136, having the conformation represented in FIG. 26, are shown in FIGS. 27a-27e. In particular, FIGS. 27a-27e show, in cross-sectional view, an enlarged detail of FIG. 26, at the trench 132 filled with the trench dielectric 136.

Figure 21:
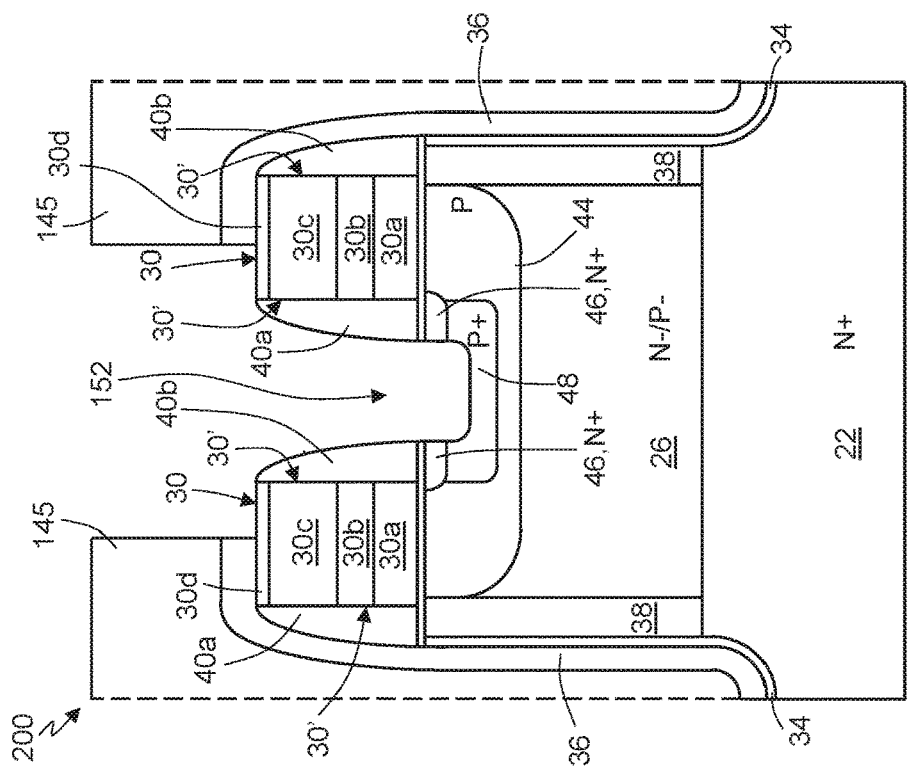
Figure 22:
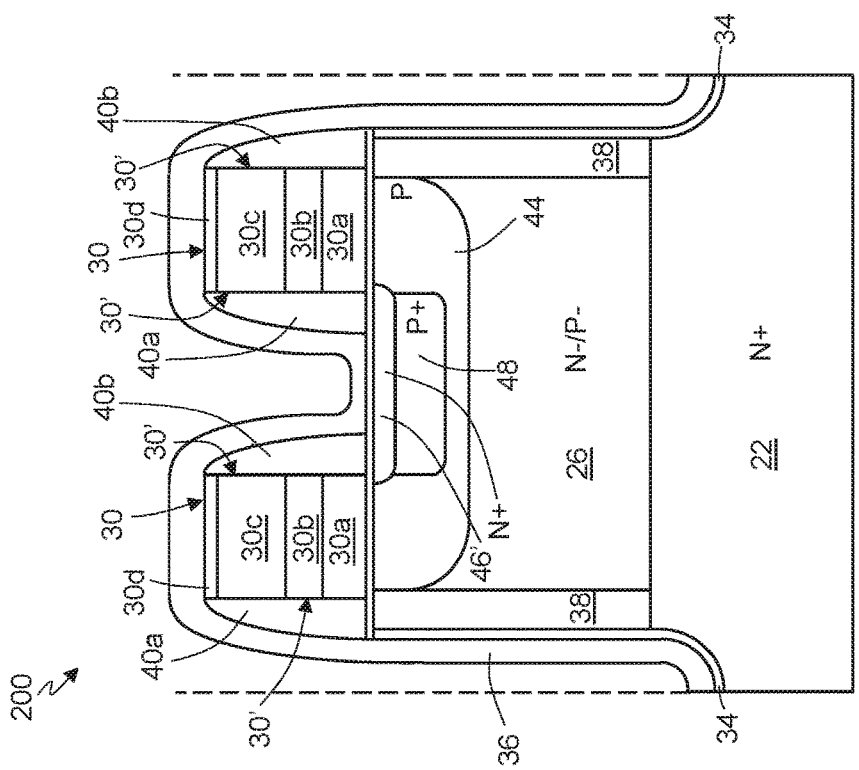

With reference to FIG. 27a (here only one trench is shown but what has been described equally applies to a plurality of trenches), after the step of FIG. 21, deposited on the wafer 200 (and hence also in the trench 132) are successive layers of silicon nitride 181, silicon oxide 183, and polysilicon 185. The second trench dielectric 36, formed according to the step of FIG. 21, has, according to this embodiment, a thickness equal to $d_{MIN}$ comprised between 50 nm and 200 nm. The silicon-nitride layer 181 has a thickness of some tens of nanometers, and the silicon-oxide layer 183 has a thickness of approximately 100 nm. The polysilicon layer 185 is deposited until the trench 132 is filled completely.

Then (FIG. 27b), a partial etch of the polysilicon layer 185 is carried out (etch selective with respect to the silicon oxide) in such a way as to remove the polysilicon 185 until the depth equal to approximately $z_1$ is reached. Consequently, following upon this step, the bottom of the trench 132 is filled completely with respective portions of the layers of silicon nitride 181, silicon oxide 183, and the remaining polysilicon 185 not removed by the etch.

Then (FIG. 27c), an etch of the silicon oxide 183 is carried out so as to remove completely said layer from the wafer 200 and from the trench 132 except for the portion of the silicon-oxide layer 183 protected by the polysilicon 185 not removed at the previous step of FIG. 27b. Then (FIG. 27d), the silicon-nitride layer 181 is removed from the wafer 200 and from the trench 132 except for the portion of the silicon-nitride layer 181 protected by the silicon oxide 183 and by the polysilicon 185 not removed in the steps of FIGS. 27b and 27c.

Next (FIG. 27e), the polysilicon 185 is removed completely from the trench 132. A further dielectric layer is thus formed in depth in the trench 132, in particular starting substantially from the depth $z_1$ as far as the bottom of the trench 132. This further dielectric layer has a thickness equal to $d_{MAX}$-$d_{MIN}$ and, together with the second trench dielectric 36, forms the trench dielectric 136 of FIG. 26. Processing of the wafer 200 can then proceed with the steps of FIGS. 23 onwards.

This embodiment presents the advantage of improving the degree of freedom between the on-state drain-to-source resistance $R_{DS\_ON}$ and the phenomenon of hot-carrier injection (HCI). The conformation of the dielectric region 36 of FIG. 26 presents the advantage of enabling a ground shield to be obtained that is closer to the drain region 38 in the proximity of the gate electrode 30 (which is a critical region for the HCI phenomenon), with consequent reduction of the electrical field and hence of the carrier-trapping phenomenon. Descending in depth along Z, the thickening of the dielectric 136 (from the value $d_{MIN}$ to the value $d_{MAX}$) prevents accumulation of the lines of potential on the terminal part of the shield up against the drain region 38, with consequent reduction of the electrical field in said region.

Moreover, the potential lines resulting from a structure of this type have a smooth curvature in so far as, as has been said, a thick dielectric 136 (with a thickness $d_{MAX}$) makes it possible to render the lines of field in said region less dense. Hence, the distribution of electrical field is improved as compared to devices of a known type and also as compared to the embodiments of FIGS. 4, 7, 8.

Figure 28A:
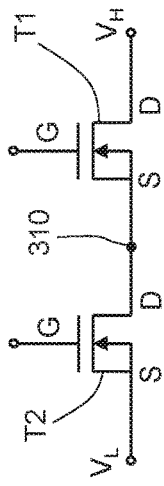
FIG. 28a shows a circuit diagram of a half-bridge block including two transistors coupled together through a common terminal.
Figure 28B:
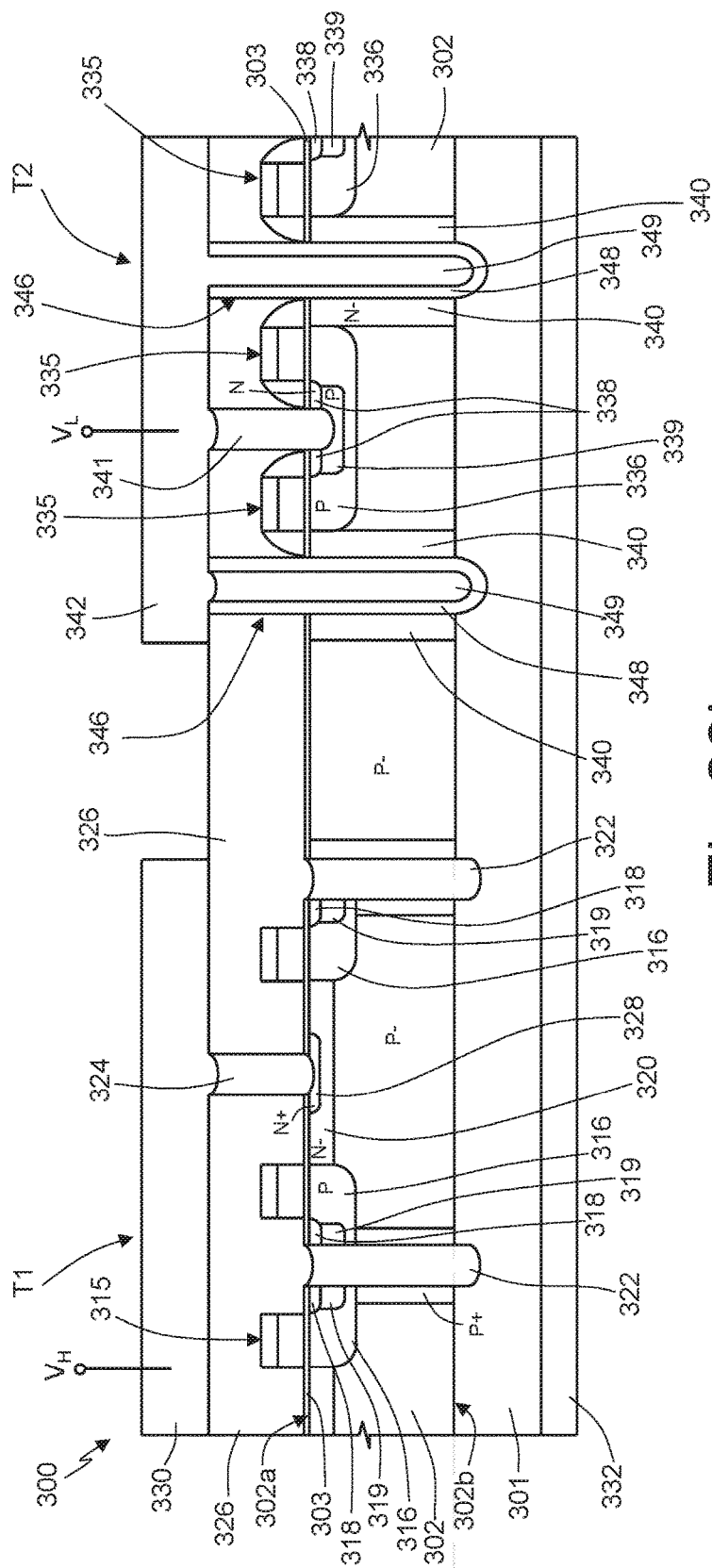
FIG. 28b shows, in lateral sectional view, an embodiment of the half-bridge block of FIG. 28a, in which one of the transistors is provided according to any one of the embodiments of FIG. 2, 4-8 or 26.

FIG. 28a shows a circuit diagram of a half-bridge block provided by means of two MOSFETs. FIG. 28b shows, in cross-sectional view, a wafer 300 including a monolithic block of MOSFETs that provide the half-bridge block of FIG. 28a.

With reference to FIG. 28a, a first transistor T1 of an N type, and a second transistor T2, which is also of an N type, are present, which have each a respective drain electrode D, source electrode S, and gate electrode G. The drain electrode D of the transistor T1 ("high-side" transistor) can be biased, in use, at a voltage $V_H$, whilst the source electrode S of the transistor T2 ("low-side" transistor) can be biased, in use, at a voltage $V_L$, with $V_H > V_L$. The source electrode of the transistor T1 is electrically coupled to the drain electrode of the transistor T2 at a common node 310.

With reference to FIG. 28b, the transistor T1 is set on the left of the section shown, whereas the transistor T2 is set on the right of the section shown.

The wafer 300 comprises a substrate 301, made of semiconductor material, for example silicon, with a doping of an N+ type, and a structural region 302, for example silicon grown epitaxially, of a P type. The structural region 302 has a top side 302a and a bottom side 302b, where the bottom side 302b is in contact with the substrate 301.

The transistor T1 includes: gate electrodes 315 arranged on the top side 302a of the structural region 302 and separated from the latter by a gate dielectric layer 303; body regions 316, formed in the structural region 302 and facing the top side 302a of the structural region 302; source regions 318 formed in the structural region 302, inside the body regions 316, and facing the top side 302a of the structural region 302; p-wells 319 formed in the structural region 302, inside the body regions 316, underneath the source regions 318; and drain regions 320, which extend in the structural region 302, facing the top side 302a of the structural region 302, between body regions 316. One or more plugs 322 made of electrically conductive material, for example metal, extend through the structural region 302 starting from the top side 302a until the substrate 301 is reached, and terminating inside the substrate 301. The plugs 322 are in electrical contact with respective source regions 318 and have the function of forming an electrical connection between the source regions 318 and the substrate 301.

Extending over the structural region 302 and the gate electrodes 315 is a dielectric layer 326, for example made of silicon oxide, as a protection and insulation of the gate electrodes and of the plugs 322. A further conductive plug 324 extends through the dielectric layer 326 and the gate oxide 303 until it reaches and comes into electrical contact with the drain region 320. In order to favor said electrical contact, the drain region 320 locally has an electrical-contact region 328 having a level of doping higher than the doping of the drain region 320.

A metallization 330 extends over the wafer 300, on the dielectric layer 326, in electrical contact with the plug 324, to form a drain electrode D of the transistor T1. A metallization 332 extends over the back of the wafer 300, in electrical contact with the substrate 301 and with the source regions 318 (via the substrate 301 and the plugs 322). The metallization 332 concurs in forming a source electrode for the transistor T1.

The transistor T2 is a power device according to any one of the embodiments described with reference to FIGS. 2-8 or to FIGS. 26 and 29, and obtained according to the manufacturing steps described previously.

The transistor T2 includes: gate electrodes 335 arranged on the top side 302a of the structural region 302 and separated from the latter by the gate dielectric layer 303; body regions 336, formed in the structural region 302 and facing the top side 302a of the structural region 302; source regions 338 formed in the structural region 302, inside the body regions 336, and facing the top side 302a of the structural region 302; p-wells 339 formed in the structural region 302, inside the body regions 336, underneath the source regions 338; and drain regions 340 (LDD regions), which extend vertically in the structural region 302 (in the direction Z), between the top side 302a of the structural region 302 and the bottom side 302b of the structural region 302.

A conductive plug 341 extends through the dielectric layer 326 and the gate oxide 303 until it reaches and comes into electrical contact with respective source regions 338 and p-wells 339. A metallization 342 extends over the wafer 300, on the dielectric layer 326, in electrical contact with the plug 341, to form a source electrode S of the transistor T2. The metallizations 330 of the transistor T1 and 342 of the transistor T2 are electrically insulated from one another.

The transistor T2 further comprises deep trenches 346, which extend through the dielectric layer 326, the gate oxide 303, the structural region 302, and part of the substrate 301, to terminate in the substrate 301. In particular, the trenches 346 are, in this case, provided according to the embodiment of FIG. 29 (definition and etching using the lithographic technique), but can alternatively be provided according to any of the embodiments described with reference to FIGS. 2-8 or FIG. 26, and manufactured as described with reference, in particular, to FIGS. 18-23.

The trenches 346 include one or more dielectric insulation layers 348 and an internal conductive region 349, surrounded by the one or more dielectric insulation layers. In particular, the trenches 346 extend adjacent to the drain regions 340.

The drain regions 340 of the transistor T2 are in electrical contact with the substrate 301 and with the metallization 332. Consequently, the source regions 318 of the transistor T1 and the drain regions 340 of the transistor T2 are electrically coupled together. The metallization 332 and the substrate 301 provide the common node 310 of FIG. 28a.

From an examination of the characteristics of the disclosure provided according to the present disclosure, the advantages that it affords are evident.

The horizontal dimensions (measured along X), or pitch, of a power device according to any one of the embodiments of the present disclosure are considerably reduced as compared to the known art; the drain electrode is provided on the back of the wafer, enabling a packaging of a standard type; the performance is not impaired, and is comparable to that of horizontal-channel LDMOS devices of a known type.

Moreover, thanks to the fact that during formation of the LDD regions the spacers 40a, 40b function as hard-masks, the alignment between the gate electrodes and the drain regions is carefully controlled, reducing the parasitic capacitances.

Thanks to the implementation of the concept of superjunction, the phenomena of hot carrier injection are negligible.

The specific on-state drain-to-source resistance $R_{DS\_ON}$ is low thanks to the reduced pitch of the elementary cell (and hence of a device including a plurality of elementary cells) and thanks also to the doses of LDD used.

In addition, the internal capacitances are minimized, enabling reduction of the gate charge $Q_G$.

Finally, it is clear that modifications and variations may be made to what has been described and illustrated herein, without thereby departing from the sphere of protection of the present disclosure.

Figure 16:
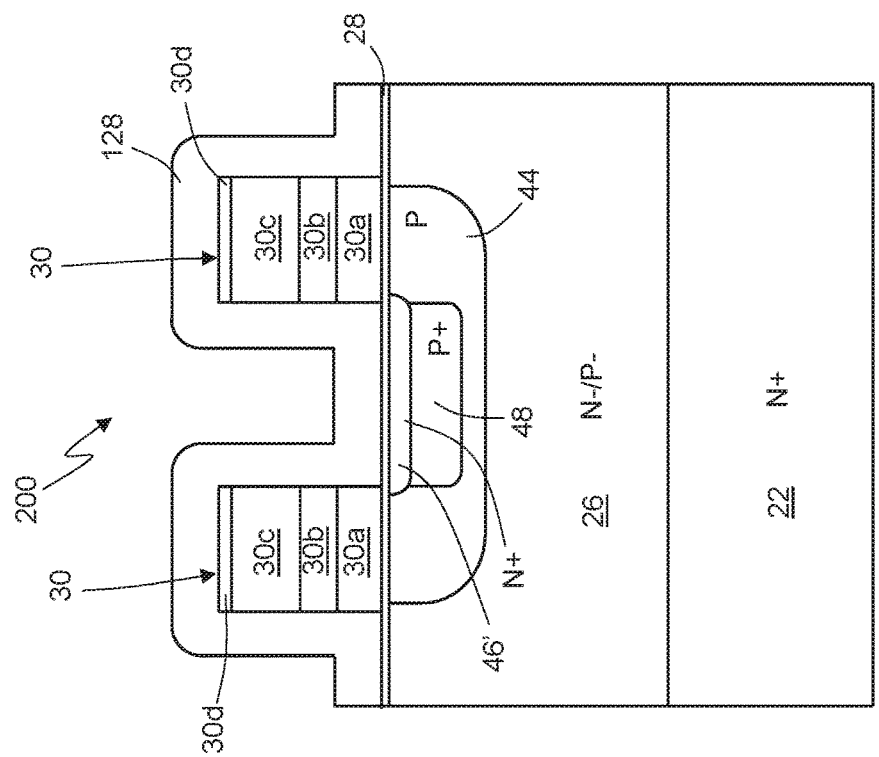
Figure 17:
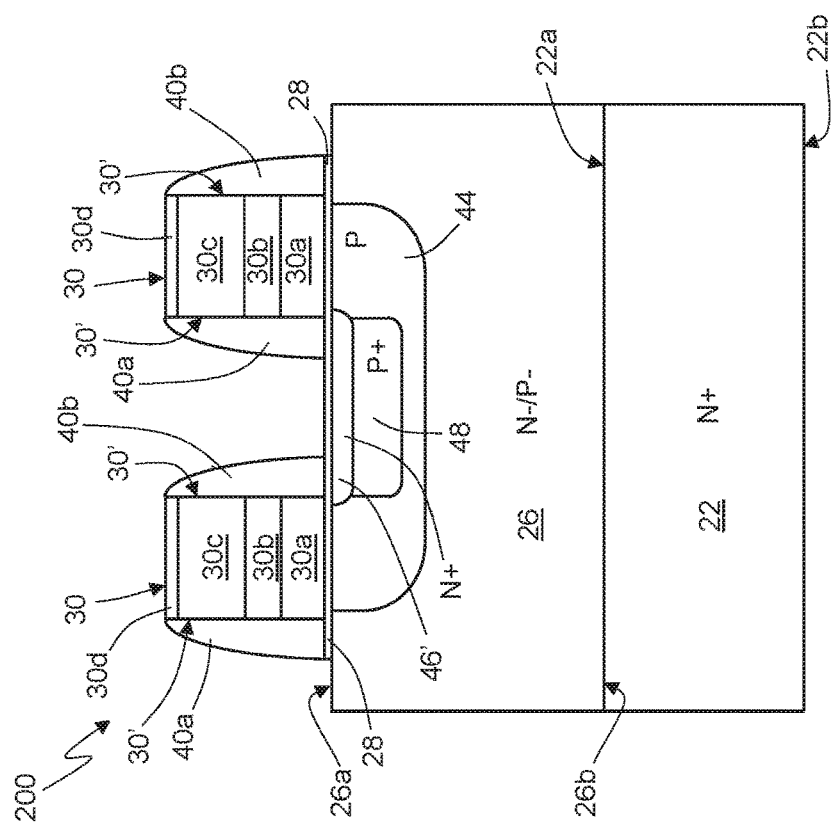
Figure 29:
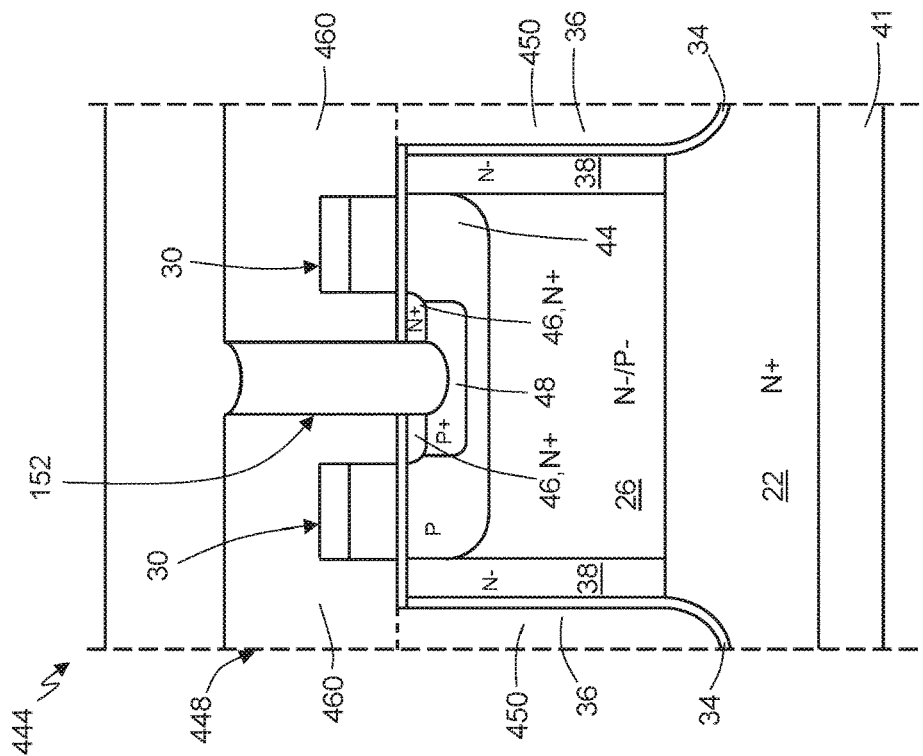
FIG. 29 shows, in lateral sectional view, an elementary cell of a power device according to a further embodiment of the present disclosure.

For example, as shown in FIG. 29, the steps of FIGS. 16 and 17, which lead to formation of the spacers 40a and 40b, may be replaced by a step of formation of a thick dielectric layer 420, for example silicon oxide deposited, on gate electrodes 30, so as to cover the gate electrodes 30 completely. Then, said thick dielectric layer 420 is selectively removed in regions of the wafer in which the trench/trenches 132 and the trench/trenches 152, are to be formed, and is preserved alongside, and above, the gate electrodes 30. In this way, etching of the wafer to form the trench/trenches 132 and the trench/trenches 152 may be carried out without the aid of further masks in so far as the thick dielectric layer 420 operates itself as etch mask.

Filling of the trenches 132 includes one or more dielectric layers and a conductive filling 32, according to any one of the embodiments of FIGS. 1-8, and 26.

Figure 30:
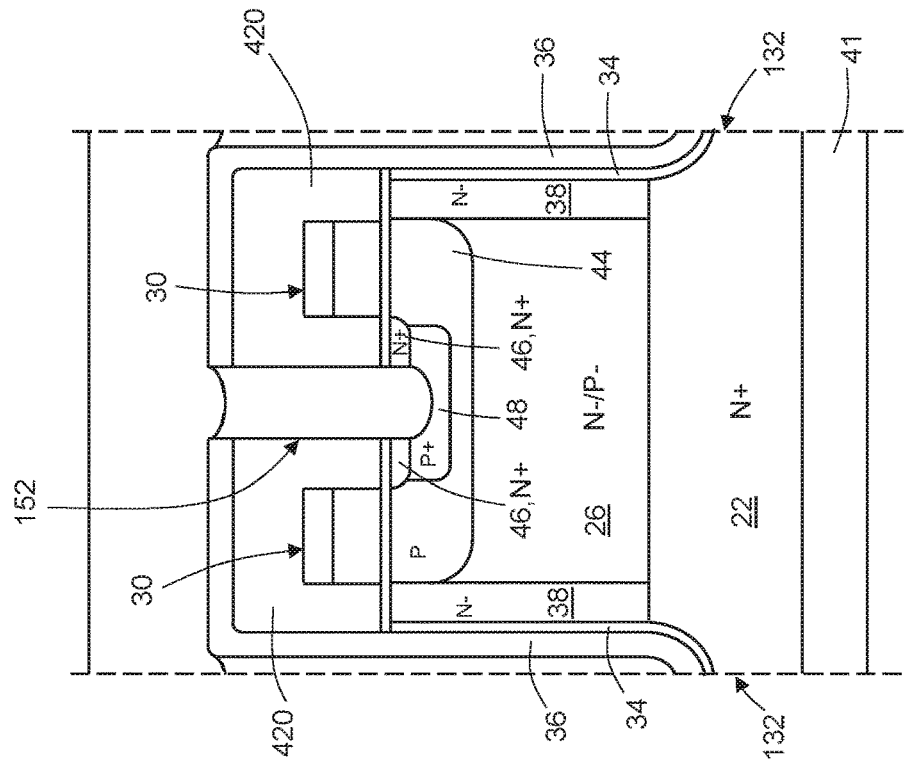
FIG. 30 shows, in lateral sectional view, an elementary cell of a power device according to a further embodiment of the present disclosure.

According to a further embodiment, shown in FIG. 30, an elementary cell 448 of a power device 449 includes trenches 132 completely filled with dielectric material, for example silicon oxide, which forms a trench filling dielectric 450. A protective dielectric layer 460, made, for example, of silicon oxide, moreover covers the gate electrodes 30, which, in this case, include a polysilicon layer 30a and a silicide layer 30b. The protection dielectric layer 460 protects and insulates electrically the gate electrodes. According to one embodiment, the layers 450 and 460 are formed simultaneously in a single step of deposition of silicon oxide, or other dielectric material. Elements of the elementary cell 448 that are in common to those of the elementary cell 21 of FIG. 2 are designated by the same reference numbers and are not described any further. The alternative embodiments of FIG. 6 (with reference to the presence of the region 82) and of FIG. 8 (with reference to the region 102) may be applied to the embodiment of FIG. 30.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an electronic semiconductor device, comprising:
    providing in a substrate a first structural region having a first conductivity, the first structural region including a first side;
    forming, on the first side of the first structural region, a second structural region having a first side exposed, a second side opposite the first side and facing the second side of the first structural region, and having a second conductivity opposite to the first conductivity;
    forming a body region having the second conductivity in the second structural region at the first side of the second structural region;
    forming a source region having the first conductivity within the body region and facing the first side of the second structural region;
    removing selective portions of the second structural region to form a through hole extending through from the first side to the second side of the second structural region;
    removing selective portions of the first structural region exposed through said through hole so as to form a first trench, which extends through the second structural region;
    forming a trench dielectric region inside the first trench;
    forming a first trench conductive region inside the trench dielectric region;
    removing selective portions of the second structural region in the body region so as to form a second trench;
    forming a second trench conductive region inside the second trench so that the second trench conductive region is in electrical contact with the body region and with the source region; and
    electrically coupling the first and second trench conductive regions,
    forming a drain region having the first conductivity extending in the second structural region from the first side to the second side of the second structural region to contact the first structural region; the drain region being in direct contact with the body region and the trench dielectric region;
    forming a gate electrode on the first side of the second structural region between the source region and the drain region;
    forming a dielectric layer on the gate electrode; and
    selectively removing portions of the dielectric layer in regions where the first and second trenches are to be formed and preserving the dielectric layer alongside and above the gate electrode.

2. The method of claim 1, wherein forming the dielectric layer on the gate electrode comprises simultaneously forming the trench dielectric region inside the first trench.

3. The method of claim 1, wherein forming the second structural region comprises forming a buffer region extending from the first side towards the second side of the second structural region, and wherein forming the body region comprises forming the body region in the buffer region.

4. The method of claim 3, wherein forming the buffer region comprises epitaxially growing the buffer region.

5. The method of claim 1, wherein forming the second structural region comprises forming a buffer region extending from the second side towards the first side of the second structural region, the buffer region having the first conductivity type and extending on and in direct contact with the first side of the substrate.

6. The method of claim 5, wherein forming the buffer region comprises one of epitaxially growing the buffer region and implanting a dopant species having the first conductivity type into the second structural layer.

7. The method according to claim 1, wherein the step of forming the trench dielectric region includes depositing one or more dielectric materials on an inner wall and on a bottom of the first trench.

8. The method according to claim 1, wherein forming the trench dielectric region includes:
    depositing a first layer of filling dielectric on an inner wall and on a bottom of the first trench; and
    depositing a second layer of filling dielectric in the trench, the second layer of filling dielectric covering the first layer of filling dielectric and extending alongside the gate electrode.

9. The method according to claim 8, wherein forming the trench dielectric region further includes:
    depositing a third layer of filling dielectric in the first trench;
    removing selectively the third layer of filling dielectric except for portions of the third layer of filling dielectric which extend in regions corresponding to walls of the first trench close to the bottom of the first trench so that the trench dielectric region has a first thickness at a first depth value and a second thickness, greater than the first thickness, at a second depth value greater than the first depth value.

10. The method according to claim 1, wherein forming the drain region includes performing a masked slanted implantation of dopant species, which have the first conductivity, in the second structural region, such that the drain regions extends adjacent to a wall of the first trench.

11. A method for manufacturing an electronic semiconductor device, comprising:
    forming a structural region on a substrate, the structural region including a first side opposite the substrate and a second side facing the substrate;
    forming a gate dielectric layer on the first side of the structural region;
    forming a pair of gate electrodes on the gate dielectric layer, the gate electrodes being spaced apart by a distance in a first direction parallel to the first side of the structural region;
    forming a dielectric layer on the pair of gate electrodes;
    selectively removing portions of the dielectric layer on the pair of gate electrodes in regions where a pair of first trenches and a second trench are to be formed while maintaining the dielectric layer along sides and over each of the gate electrodes in the pair of gate electrodes;

forming a body region having a first conductivity in the structural region between the pair of gate electrodes and at the first side of the first structural region;

forming an intermediate source region having a second conductivity opposite the first conductivity within the body region and facing the first side of the second structural region;

forming an enrichment region having the first conductivity in the body region, the enrichment region extending to a greater depth than a depth of the intermediate source region and being separated from the first side of the structural region by the intermediate source region;

removing selective portions of the structural region except between the pair of gate electrodes to form the pair of first trenches extending through the structural region from the first side to second side and extending beyond the second side into the substrate;

forming first trench dielectric regions inside the pair of first trenches;

forming drain regions in the structural region, each drain region being formed in the structural region adjacent one of the first trenches and extending through the structural region from the first side to the second side, and each drain region being in electrical contact with the body region;

forming the second trench between the pair of gate electrodes, the second trench extending through the intermediate source region and into the enriched region, the second trench defining two source regions corresponding to the remaining portions of the intermediate source region adjacent the second trench;

forming first trench conductive regions on the first trench dielectric regions in each of the first trenches; and forming a second trench conductive region inside the second trench, the second trench conductive region being in electrical contact with the body region and with the two source regions.

12. The method of claim 11, wherein forming the dielectric layer on the pair of gate electrodes comprises simultaneously forming the trench dielectric region inside the pair of first trenches.

13. The method of claim 11, wherein forming the structural region comprises forming a buffer region extending from the first side towards the second side of the structural region, and wherein forming the body region comprises forming the body region in the buffer region.

14. The method of claim 13, wherein forming the buffer region comprises epitaxially growing the buffer region.

15. The method of claim 11, wherein forming the structural region comprises forming a buffer region extending from the second side towards the first side of the structural region, the buffer region having the second conductivity type and extending on and in direct contact with the substrate.

16. The method of claim 15, wherein forming the buffer region comprises one of epitaxially growing the buffer region and implanting a dopant species having the first conductivity type into the structural layer.

17. The method of claim 11 further comprising electrically coupling the first trench conductive regions to the second trench conductive region.

18. The method of claim 12 further comprising electrically coupling the first and second trench conductive regions to a reference voltage.

19. The method of claim 11, wherein forming first trench dielectric regions inside the pair of first trenches comprises depositing one or more dielectric materials on an inner wall and on a bottom of each of the first trenches.

20. The method of claim 11, wherein forming drain regions in the structural region comprises:

for each drain region, performing a masked slanted implantation of dopant species through the corresponding first trench, the dopant species having the second conductivity; and performing a thermal annealing that diffuses the dopant species and forms the drain regions as a lightly-doped-drain regions.

* * * * *